US00RE41721E

(19) United States
(12) Reissued Patent
Nakamura et al.

(10) Patent Number: US RE41,721 E
(45) Date of Reissued Patent: Sep. 21, 2010

(54) SEMICONDUCTOR DEVICE HAVING AN IMPROVED CONNECTED ARRANGEMENT BETWEEN A SEMICONDUCTOR PELLET AND BASE SUBSTRATE ELECTRODES

(75) Inventors: Atsushi Nakamura, Fuchu (JP); Kunihiko Nishi, Kokubunji (JP)

(73) Assignee: Renesas Electronics Corporation, Tokyo (JP)

(21) Appl. No.: 09/613,541

(22) Filed: Jul. 7, 2000

Related U.S. Patent Documents

Reissue of:
(64) Patent No.: 5,777,391
Issued: Jul. 7, 1998
Appl. No.: 08/570,646
Filed: Dec. 11, 1995

(30) Foreign Application Priority Data

Dec. 20, 1994 (JP) ..... 6-316444
May 25, 1995 (JP) ..... 7-126405

(51) Int. Cl.

| | |
|---|---|
| ***H01L 23/13*** | (2006.01) |
| ***H01L 23/48*** | (2006.01) |
| ***H01L 23/31*** | (2006.01) |
| ***H01L 23/28*** | (2006.01) |
| ***H01L 23/12*** | (2006.01) |
| ***H01L 25/10*** | (2006.01) |
| ***H01L 23/498*** | (2006.01) |
| ***H01L 23/14*** | (2006.01) |

(52) U.S. Cl. ..... 257/778; 257/E25.023; 257/E23.075; 257/E23.069; 257/E23.008; 257/E23.004; 257/773; 257/774; 257/679; 257/786; 257/784; 257/737; 257/738; 257/778; 257/780; 438/108; 438/617

(58) Field of Classification Search ..... 257/E23.004, 257/E23.008, E23.069, E23.075, E25.023, 257/737, 738, 734, 773, 774, 786, 784, 679, 257/668, 778, 777, 780, 678, 693, 692, 664; 438/15, 108, 113, 617, 128; 29/834, 832
See application file for complete search history.

(56) References Cited

U.S. PATENT DOCUMENTS 4,688,074 A * 8/1987 Iinuma ..... 349/151
4,996,587 A * 2/1991 Hinrichsmeyer et al. .... 257/676
5,107,328 A * 4/1992 Kinsman ..... 257/784
5,148,265 A 9/1992 Khandros et al.

(Continued)

FOREIGN PATENT DOCUMENTS

FR 2694139 * 1/1994 ..... 439/71

(Continued)

OTHER PUBLICATIONS

Nikkei electronics Feb. 28, 1994 (No. 602). pp. 111–117. (with translation).*

*Primary Examiner*—Alexander O Williams
(74) *Attorney, Agent, or Firm*—Antonelli, Terry, Stout & Kraus, LLP.

(57) ABSTRACT

A semiconductor device comprising a semiconductor pellet mounted on a pellet mounting area of the main surface of a base substrate, in which first electrode pads arranged on the back of the base substrate are electrically connected to bonding pads arranged on the main surface of the semiconductor pellet. The base substrate is formed of a rigid substrate, and its first electrode pads are electrically connected to the second electrode pads arranged on its reverse side. The semiconductor pellet is mounted on the pellet mounting area of the main surface of the base substrate, with its main surface downward, and its bonding pads are connected electrically with the second electrode pads of the base substrate through bonding wires passing through slits formed in the base substrate.

35 Claims, 13 Drawing Sheets

U.S. PATENT DOCUMENTS 5,148,266 A 9/1992 Khandros et al.
5,258,330 A 11/1993 Khandros et al.
5,293,068 A * 3/1994 Kohno et al. ..... 257/676
5,346,861 A 9/1994 Khandros et al.
5,347,159 A 9/1994 Khandros et al.
5,384,689 A * 1/1995 Shen ..... 361/761
5,422,435 A * 6/1995 Takiar et al. ..... 174/521
5,438,478 A * 8/1995 Kondo et al. ..... 361/704
5,442,231 A * 8/1995 Miyamoto et al. ..... 257/784
5,474,958 A * 12/1995 Djennas et al. ..... 29/827
5,502,289 A * 3/1996 Takiar et al. ..... 174/266
5,519,251 A * 5/1996 Sato et al. ..... 257/778
5,608,265 A 3/1997 Kitano et al.
5,650,593 A * 7/1997 McMillan et al. ..... 174/542
5,661,086 A * 8/1997 Nakashima et al. ..... 257/668
5,674,785 A * 10/1997 Akram et al. ..... 438/15
5,677,566 A * 10/1997 King et al. ..... 257/778
5,679,977 A 10/1997 Khandros et al.
5,682,061 A 10/1997 Khandros et al.
5,684,330 A * 11/1997 Lee ..... 257/778
5,685,885 A 11/1997 Khandros et al.
5,729,051 A * 3/1998 Nakamura ..... 257/668
5,753,974 A * 5/1998 Masukawa ..... 257/737
5,811,879 A * 9/1998 Akram ..... 257/723
5,843,806 A * 12/1998 Tsai ..... 438/107
5,848,467 A 12/1998 Khandros et al.
5,852,326 A 12/1998 Khandros et al.
5,950,304 A 9/1999 Khandros et al.
6,013,948 A * 1/2000 Akram et al. ..... 257/698
6,133,627 A 10/2000 Khandros et al.
6,235,554 B1 * 5/2001 Akram et al. ..... 438/109
6,372,527 B1 4/2002 Khandros et al.
6,392,306 B1 5/2002 Khandros et al.
6,423,622 B1 * 7/2002 Chen et al. ..... 438/598
6,433,419 B2 8/2002 Khandros et al.
6,465,893 B1 10/2002 Khandros et al.
6,861,290 B1 * 3/2005 Moden ..... 438/118

FOREIGN PATENT DOCUMENTS

JP 62-272546 * 11/1987 ..... 29/827
JP 10-229257 * 8/1988
JP 63-261736 * 10/1988 ..... 257/723
JP 64-81330 3/1989
JP 64-081330 3/1989
JP 02-91345 7/1990
JP 2-91345 7/1990
JP A-5-47829 2/1993
JP 6-504408 5/1994
JP 6-268101 9/1994
JP A-6-314719 11/1994
WO WO-92/05582 4/1992

* cited by examiner

SEMICONDUCTOR DEVICE HAVING AN IMPROVED CONNECTED ARRANGEMENT BETWEEN A SEMICONDUCTOR PELLET AND BASE SUBSTRATE ELECTRODES

Matter enclosed in heavy brackets [ ] appears in the original patent but forms no part of this reissue specification; matter printed in italics indicates the additions made by reissue.

*More than one reissue application has been filed for the reissue of U.S. Pat. No. 5,777,391. These reissue applications are the present application Ser. No. 09/613,541, filed Jul. 7, 2000; Ser. No. 10/105,236, filed on Mar. 26, 2002; Ser. No. 11/182,039 filed on Jul. 15, 2005; Ser. No. 11/182,040, also filed on Jul. 15, 2005; Ser. No. 11/256,620, filed on Oct. 24, 2005; Ser. No. 11/256,621, also filed on Oct. 24, 2005; Ser. No. 11/285,730, filed on Nov. 23, 2005 and Ser. No. 11/285,729, filed on Nov. 23, 2005.*

*The present reissue application also claims the benefit under 35 USC §120 of the filing date of Dec. 11, 1995 of Ser. No. 08/570,646, now U.S. Pat. No. 5,777,391, and benefit under 35 USC §119 of Japanese Application No. 6-316,444, filed on Dec. 20, 1994 and Japanese Application No. 7-126405, filed May 25, 1995, the subject matter of which is incorporated herein by reference.*

BACKGROUND OF THE INVENTION

The present invention relates to a semiconductor device and a method of manufacture thereof and more particularly to a technology effectively applied to a semiconductor device and a method of manufacture thereof, the device having a structure in which a semiconductor pellet is mounted on a pellet mounting area on the main surface of a base substrate and in which a first electrode pad on the back of the base substrate is electrically connected to an external terminal on the main surface of the semiconductor pellet.

A semiconductor device with a ball grid array (BGA) structure has been introduced as a semiconductor device having a high level of integration in the Nikkei Electronics. Feb. 28, 1994, pp. 111–117, published by Nikkei McGraw-Hill. The BGA structure of such as semiconductor device, as shown in FIG. 16 (cross section of an essential part), has a semiconductor pellet 2 mounted on a pellet mounting area of the main surface of the base substrate 1 and a plurality of bump electrodes 4 arranged in grid on the back of the base substrate 1 opposite the main surface.

The base substrate 1 may be made from a printed wiring board of two-layer wiring structure. Second electrode pads 1A are arranged in a peripheral area of the main surface of the base substrate 1 (around the pellet mounting area), while first electrode pads 1B are arranged on the back of the base substrate 1 opposite the main surface. The second electrode pads 1A are electrically connected to through-hole conductors 1C via conductors $\mathbf{1}A_1$ arranged on the main surface of the base substrate 1. The first electrode pads 1B are electrically connected to the through-hole conductors 1C via conductors $\mathbf{1}B_1$ arranged on the back of the base substrate 1.

The semiconductor pellet 2 may comprise mainly a semiconductor substrate 2B of single-crystal silicon. On the main surface of the semiconductor substrate 2B (device forming surface) is formed a logic circuit system, a memory circuit system or a combination of these. A plurality of bonding pads 2A are arranged on the main surface of the semiconductor substrate 2B. The bonding pads 2A are formed in the top of the interconnect layers formed on the main surface of the semiconductor substrate 2B.

The bonding pads 2A on the semiconductor pellet 2 are electrically connected to the second electrode pads 1A on the main surface of the base substrate 1 through bonding wires 6. In other words, the bonding pads 2A on the semiconductor pellet 2 are electrically connected to the first electrode pads 1B through the bonding wires 6, second electrode pads 1A, conductors $\mathbf{1}A_1$, through-hole conductors 1C and conductors $\mathbf{1}B_1$.

The semiconductor pellet 2 and the bonding wires 6 are sealed with a resin sealing body 7 formed on the main surface of the base substrate 1. The resin sealing body 7 is formed by transfer molding.

The bump electrodes 4 are electrically and mechanically connected to the surfaces of the first electrode pads 1B on the base substrate 1. The bump electrodes 4 may be formed from an alloy material such as Pb-Sn.

The semiconductor device of such a BGA structure is mounted on a mounting board, with the bump electrodes 4 electrically and mechanically connected to electrode pads arranged on the mounting surface of the mounting board.

Another example of semiconductor device having a high circuit density is disclosed in U.S. Pat. Ser. No. 5148265, which shows a semiconductor device in which the base substrate is made from a filmlike flexible substrate. In this semiconductor device, the semiconductor pellet is mounted, with its main surface downward, on the pellet mounting area of the main surface of the base substrate made of a flexible substrate, and the bonding pads arranged on the main surface of the semiconductor pellet are electrically connected to the second electrode pads arranged on the back of the base substrate through the bonding wires. The second electrode pads on the base substrate are electrically connected to the first electrode pads on the back of the base substrate through conductors that are also arranged on the back. Bump electrodes are electrically and mechanically connected to the surfaces of the first electrode pads.

The semiconductor device of the above construction is mounted on the mounting surface of a mounting board, with its bump electrodes electrically and mechanically connected to the electrode pads arranged on the mounting surface of the mounting board.

SUMMARY OF THE INVENTION

In the semiconductor device with the BGA structure, as shown in FIG. 16, the second electrode pads 1A arranged on the main surface of the base substrate 1 are electrically connected through the through-hole conductors 1C to the first electrode pads 1B arranged on the back of the base substrate 1. The through-hole conductors 1C comprises a hole area formed within a through-hole in the base substrate 1 and a land area (fringe portion) formed on the main surface and back surface of the base substrate 1. The inner diameter of the through-hole may be around 0.3 mm and the outer diameter of the land area of the through-hole conductor 1C may be about 0.6 mm. The inner diameter of the through-hole and the outer diameter of the land area of the through-hole conductor 1C are set large compared to the widths of the conductors $\mathbf{1}A_1$ electrically connecting the second electrode pads 1A and the through-hole conductors 1C and also compared to the widths of the conductors $\mathbf{1}B_1$ electrically connecting the first electrode pads 1B and the through-hole conductors 1C.

The circuit systems formed on the typical semiconductor pellets 2 have tended to grow in their level of integration and the number of functions they perform. With enhanced integration and more diversified functions of the circuit system, the number of bonding pads 2A of the semiconductor pellet 2 and the number of second electrode pads 1A of the base substrate 1 increase. That is, the number of through-hole conductors 1C electrically connecting the second electrode pads 1A and the first electrode pads 1B increases as the integration and function of the circuit system are enhanced. Hence, there has been a problem that the external size of the base substrate 1 increase with the increasing number of the through-hole conductors 1C, which in turn increases the size of the semiconductor device as a whole.

There is also another problem which the inventors have considered. The intervals between the through-hole conductors formed by copper foil thick film printing, etching or electroplating techniques are greater than the intervals of the bonding pads of the semiconductor pellet formed by photolithography. For this reason, in a semiconductor device with the BGA structure, as the number of the through-hole conductors 1C increases, they are positioned outwardly away from the semiconductor pellet 2. This inevitably extends the length of the conductors $\mathbf{1}A_1$ electrically connecting the second electrode pads 1A and the through-hole conductors 1C and the length of the conductors $\mathbf{1}B_1$, electrically connecting the first electrode pads 1B and the through-hole conductors 1C. This, in turn, increases inductance and reduces the operating speed of the semiconductor device.

In the semiconductor device using a flexible substrate for the base substrate, the flexible substrate may for example be formed of a polyester film or polyimide film. This flexible substrate has a small Young's modulus and is soft (low hardness) compared with a rigid substrate impregnated with epoxy resin or polyimide resin, as represented by the FR4 substrate according to the NEMA Standard. Therefore, when the bonding pads arranged on the main surface of the semiconductor pellet are connected with the second electrode pads arranged on the back of the base substrate through bonding wires, the bonding force applied to the second electrode pads is absorbed by the base substrate, preventing the bonding force and ultrasonic vibrations from being transmitted to the second electrode pads effectively. This gives rise to an apprehension that the connection strength between the bonding wires and the second electrode pads may decrease, leading to connection failures of bonding wires and reduced electric reliability of the semiconductor device.

In semiconductor devices that use a flexible substrate for the base substrate, the flexible substrate has a large thermal expansion coefficient in the planar direction and a small Young's modulus (small rigidity), which means that it is easy to bend, compared with the rigid substrate. Therefore, when the semiconductor device is mounted on the mounting surface of the mounting board, the reflow heat used during the process of mounting causes deformations to the base substrate, such as warping and twisting, which in turn reduces the flatness of the back of the base substrate with respect to the mounting surface of the mounting board, thereby lowering the mounting precision of the semiconductor device.

An object of this invention is to provide a technology that allows a reduction in the size of the semiconductor device.

Another object of this invention is to provide a technology that allows an increase in the operating speed of the semiconductor device.

Still another object of this invention is to provide a technology that can enhance electric reliability of the semiconductor device.

A further object of this invention is to provide a technology that can enhance mounting precision of the semiconductor device.

A further object of this invention is to provide a manufacturing technology for the semiconductor device that can accomplish the above objectives.

These and other objects and novel features of this invention will become apparent from the following description of this specification and the accompanying drawings.

Representative aspects of this invention may be briefly summarized as follows.

A semiconductor device in accordance with invention comprises a semiconductor pellet mounted on the pellet mounting area of the main surface of the base substrate, in which first electrode pads arranged on the back of the base substrate are electrically connected to the bonding pads on the main surface of the semiconductor pellet. The base substrate is formed of a rigid substrate, and its first electrode pads are electrically connected to second electrode pads also arranged on the back side of the base substrate. The semiconductor pellet is mounted, with its main surface downward, on the pellet mounting area of the main surface of the base substrate, and its bonding pads are electrically connected to the second electrode pads on the base substrate through bonding wires extending through slits formed in the base substrate.

A method of manufacturing a semiconductor device is also provided, in which a semiconductor pellet is mounted on the pellet mounting area of the main surface of the base substrate and in which first electrode pads arranged on the back of the base substrate are electrically connected to the bonding pads on the main surface of the semiconductor pellet. In particular, the method includes a step of mounting the semiconductor pellet, with its main surface downward, on the pellet mounting area of the main surface of the base substrate made of a rigid substrate, and a step of connecting the bonding pads on the semiconductor pellet to the second electrode pads electrically connected to the first electrode pads of the base substrate and arranged on the back of the base substrate through bonding wires extending through slits formed in the base substrate.

According to the above construction of this invention, the bonding pads of the semiconductor pellet and the first electrode pads of the base substrate can be electrically connected through the bonding wires and the second electrode pads, so it is possible to eliminate the through holes used to electrically connect the second electrode pads and the first electrode pads in prior structures. This allows the external size of the base substrate to be reduced by an amount corresponding to an area occupied by the through holes (land area), thus reducing the size of the semiconductor device as a whole.

Further, because the first electrode pads can be put closer to the second electrode pads by an amount corresponding to an area occupied by the through holes, the conductors of the base substrate that electrically connect the second electrode pads and the first electrode pads can be reduced in length. As a result, inductance can be reduced and the operating speed of the semiconductor device increased.

Further, the rigid substrate has a higher Young's modulus than a flexible substrate; therefore, when the bonding pads arranged on the main surface of the semiconductor pellet and the second electrode pads arranged on the back of the base substrate are electrically connected by bonding wires, the bonding force applied to the second electrode pads can be prevented from being absorbed by the base substrate. This assures effective transmission of the bonding force and the ultrasonic vibrations to the second electrode pads. Thus, the connection strength between the bonding wires and the second electrode pads is increased, making it possible to prevent connection failure of the bonding wires and to enhance electric reliability of the semiconductor device.

Furthermore, the rigid substrate has a small inplane thermal expansion coefficient and a high Young's modulus compared with a flexible substrate, which means the rigid substrate is harder to bend. This prevents the base substrate from being deformed (warped or twisted) due to reflow heat produced during the process of mounting the semiconductor device on the mounting surface of the mounting board. This ensures a sufficient flatness of the back of the base substrate with respect to the mounting surface of the mounting board, thus enhancing the mounting precision of the semiconductor device.

According to the above-mentioned manufacturing method of this invention, the bonding pads of the semiconductor pellet and the first electrode pads of the base substrate are electrically connected through bonding wires and second electrode pads, so the through holes electrically connecting the second electrode pads and the first electrode pads can be eliminated, making it possible to use a base substrate reduced in external size by an amount corresponding to the occupied area of the through holes. This in turn allows the manufacture of reduced-size semiconductor devices.

Further, because the bonding pads of the semiconductor pellet and the first electrode pads of the base substrate are electrically connected through bonding wires and second electrode pads, the through holes electrically connecting the second electrode pads and the first electrode pads can be eliminated, making it possible to use a base substrate whose conductors electrically connecting the second electrode pads and the first electrode pads are reduced by a length corresponding to the occupied area of the through holes. This in turn allows the manufacture of semiconductor devices with faster operating speeds.

The base substrate uses a rigid substrate having a high Young's modulus compared with a flexible substrate; therefore, when the bonding pads arranged on the main surface of the semiconductor pellet and the second electrode pads arranged on the back of the base substrate are electrically connected by bonding wires, the bonding force applied to the second electrode pads can be prevented from being absorbed by the base substrate, ensuring effective transfer of the bonding force and ultrasonic vibrations to the second electrode pads. This enhances the connection strength between the bonding wires and the second electrode pads, allowing the manufacture of the semiconductor device with high electric reliability.

Furthermore, the base substrate used is formed of a rigid substrate having a small planar thermal expansion coefficient and a high Young's modulus compared with those of a flexible substrate, which means the rigid substrate is harder to bend. As a result, the rigid base substrate is free from deformations (warping or twisting) due to reflow heat during the process of mounting the semiconductor device on the mounting surface of the mounting board. As a result, a sufficient degree of flatness of the back of the base substrate with respect to the mounting surface of the mounting board can be secured, which in turn allows the manufacture of semiconductor devices with high mounting precision.

DESCRIPTION OF THE PREFERRED EMBODIMENTS

Figure 1:
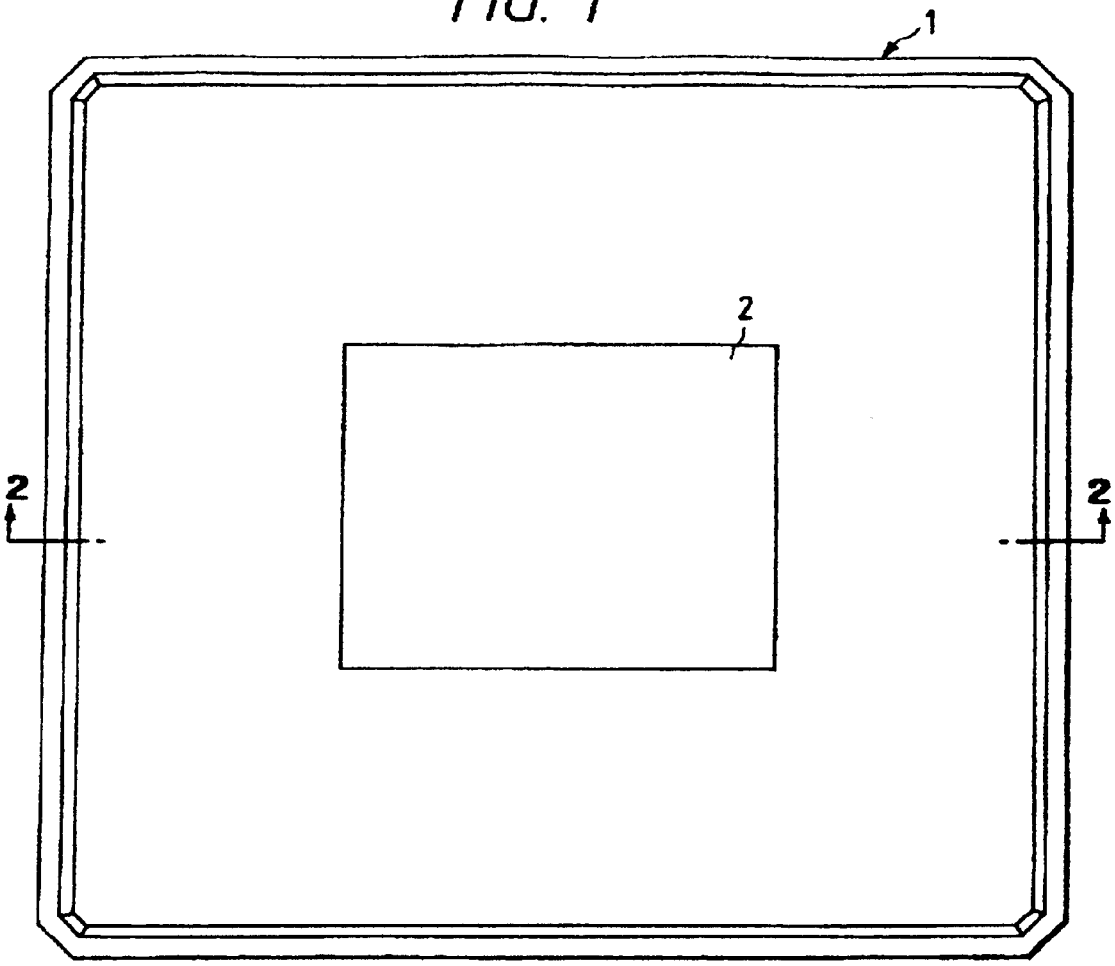
FIG. 1 is a plan view of the main surface side of the semiconductor device, as a first embodiment of this invention, that employs a BGA structure.

The construction of this invention is described in the following in conjunction with embodiments that apply this invention to a semiconductor device using the BGA structure.

In the drawings used for explaining the embodiments, components with identical functions are given like reference numerals and their explanations are not repeated.

Embodiment 1

Figure 2:
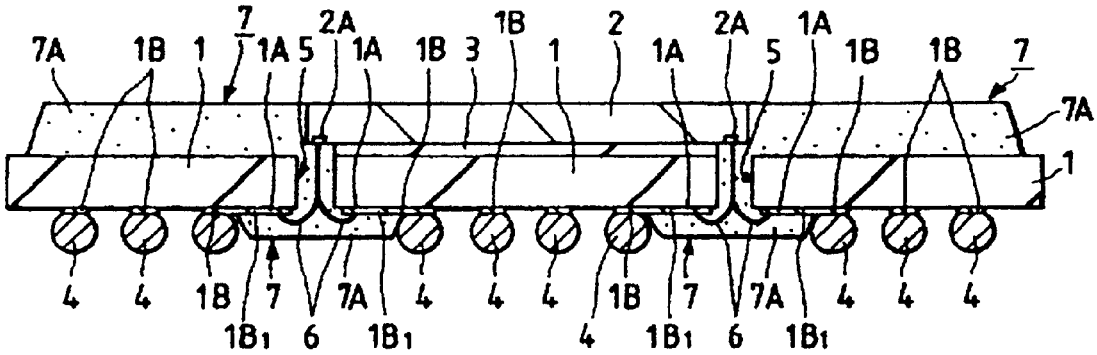
FIG. 2 is a cross section taken along the line A—A of FIG. 1.
Figure 3:
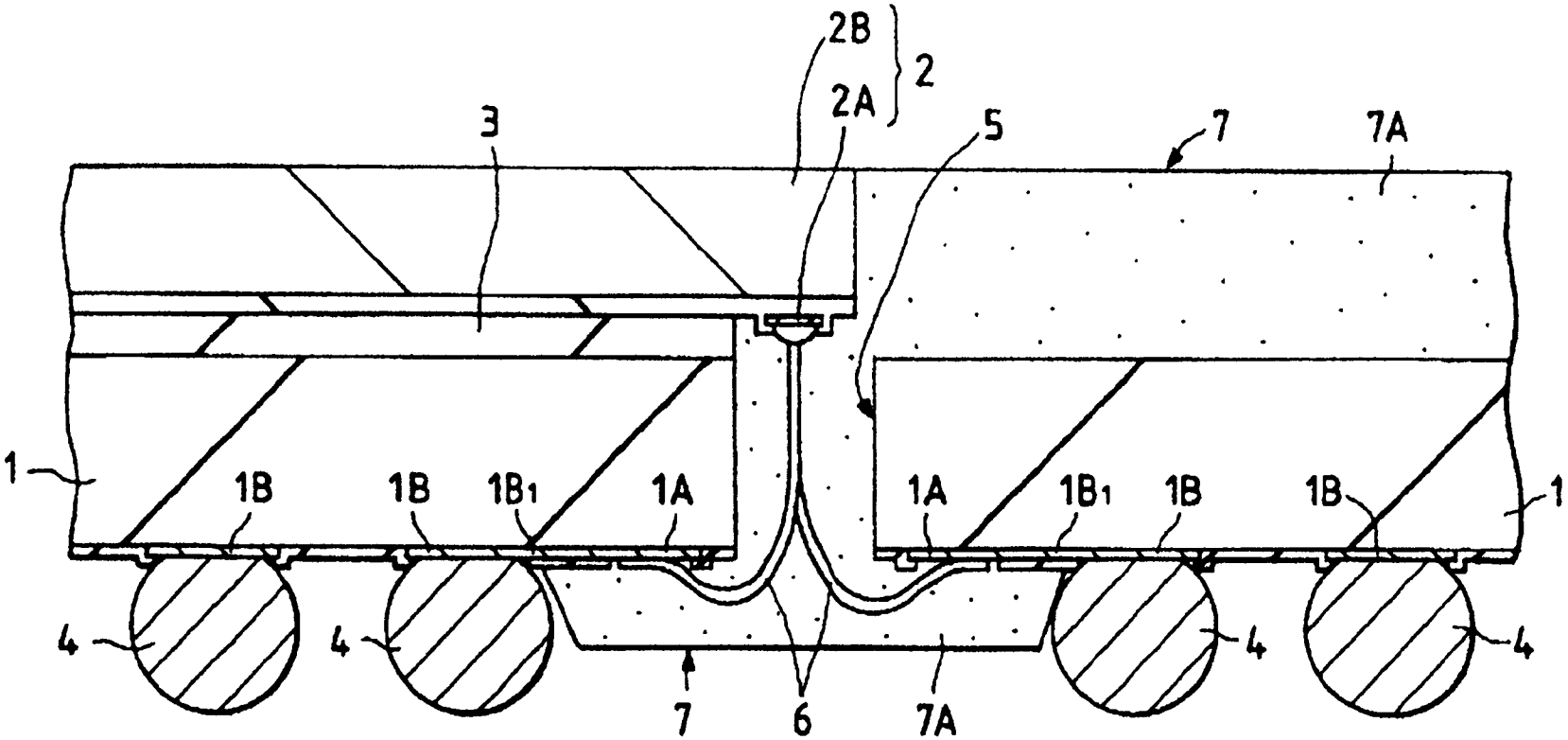
FIG. 3 is an enlarged cross section of an essential part of FIG. 2.
Figure 4:
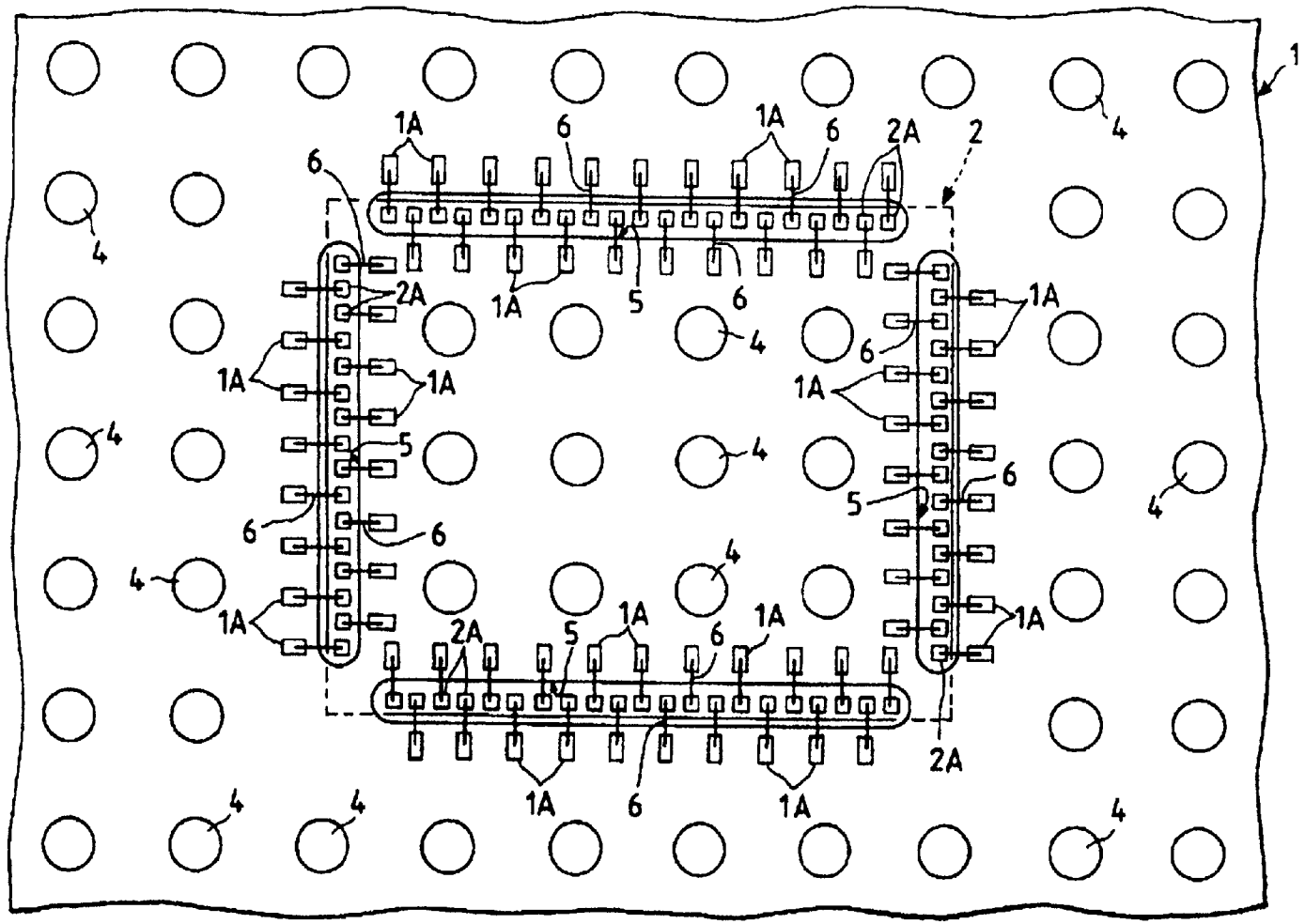
FIG. 4 is an enlarged plan view showing the state of the back side of an essential part of the semiconductor device with the resin sealing body removed.

The outline construction of a semiconductor device, as a first embodiment of this invention, that uses the BGA structure is shown in FIG. 1 (plan view of the main surface side), FIG. 2 (cross section taken along the line A—A of FIG. 1), FIG. 3 (enlarged cross section of an essential part of FIG. 2) and FIG. 4 (enlarged plan view showing the back side of an essential part of the semiconductor device with the resin sealing body removed).

As shown in FIGS. 1, 2, 3 and 4, the semiconductor device has a semiconductor pellet 2 mounted on a pellet mounting area of the main surface of a base substrate 1, with a plurality of bump electrodes 4 arranged in grid on the back of the base substrate 1 opposite the main surface.

The base substrate 1 may be formed of a printed circuit board. The printed circuit board may, for example, have a structure in which wiring is formed over the surface of a rigid substrate of glass fiber impregnated with epoxy resin, polyimide resin or maleimide resin. In other words, the base substrate 1 is formed of a rigid substrate. The rigid substrate has a high Young's modulus and is hard compared with a flexible substrate made of polyester film or polyimide film. The rigid substrate has a small thermal expansion coefficient in a planar direction, a high Young's modulus and is difficult to bend compared with the flexible substrate. For example, the rigid substrate made of a glass fiber impregnated with epoxy resin or polyimide resin has a Young's modulus of around 16–22 GPa and a thermal expansion coefficient of about $10–20\times10^{-6}1/°$ C. Flexible substrates made of polyester film or polyimide film have a Young's modulus of about 2–5 GPa and a thermal expansion coefficient of about $20–25\times10^{-6}1/°$ C.

On the back of the base substrate 1 are formed a plurality of second electrode pads 1A and first electrode pads 1B, which are electrically interconnected through conductors $\mathbf{1}B_1$ on the back of the base substrate 1. The second electrode pads 1A, first electrode pads 1B and conductors $\mathbf{1}B_1$ are formed of a Cu film, for example.

On the surfaces of the first electrode pads 1B are formed bump electrodes 4 that are electrically and mechanically connected to them. The bump electrodes 4 may be formed of, for instance, a Pb-Sn alloy.

The semiconductor pellet 2 is mounted, with its main surface (underside in FIG. 2 and 3) downward, on the pellet mounting area of the main surface of the base substrate 1. That is, the semiconductor pellet 2 is mounted facedown on the pellet mounting area of the main surface of the base substrate 1. Interposed between the main surface of the semiconductor pellet 2 and the pellet mounting area of the main surface of the base substrate 1 is an insulating layer 3, which may be formed of a polyimide-. epoxy- or silicon-base low-elasticity resin.

The semiconductor pellet 2 may be rectangular and may mainly be comprised of a semiconductor substrate 2B made of single-crystal silicon. On the main surface (device forming surface) of the semiconductor substrate 2B are formed a logic circuit system, a memory circuit system or a combination of these. Also on the main surface of the semiconductor substrate 2B, a plurality of bonding pads 2A are arranged along the sides of the rectangular surface. The bonding pads 2A are formed on the top of interconnect layers on the main surface of the semiconductor substrate 2B. That is, the bonding pads 2A are arranged in the periphery of the main surface of the semiconductor pellet 2 along each of the four sides.

The bonding pads 2A of the semiconductor pellet 2 and the second electrode pads 1A of the base substrate 1 are electrically connected to each other through bonding wires 6 running in slits 5 formed in the base substrate 1. The bonding wires 6 may be of gold (AU), copper (Cu) or aluminum (Al), and may be coated with insulating resin. The bonding wires 6 may be connected by a bonding method that utilizes ultrasonic vibrations in combination with thermocompression.

The slits 5 in the base substrate 1 are formed in the directions of the rows of the bonding pads 2A that are arranged along each side of the main surface of the semiconductor pellet 2. That is, the base substrate 1 of this embodiment has four slits 5, each of which is located above the bonding pads 2A of the semiconductor pellet 2.

The second electrode pads 1A of the base substrate 1 are placed in both areas of the back of the base substrate 1 divided by the slits 5. The second electrode pads 1A located in one of the areas of the back of the base substrate 1 demarcated by the slits 5 (inside the semiconductor pellet 2) are supplied with a power supply such as an operation voltage (3.3 V for instance) and a reference voltage (0 V for instance). The second electrode pads 1A located in the other area of the back of the base substrate 1 demarcated by the slits 5 (outside the semiconductor pellet 2) receive a signal such as an input/output signal and a control signal.

The semiconductor pellet 2 are provided with 100 bonding pads 2A on each side at a pitch of about 100 μm. The number of bonding pads 2A is increased as the level of integration and the operating speed of the circuit system mounted on the semiconductor pellet 2 increase.

The first area of the back of the base substrate 1 demarcated by the slits 5 is provided with, for example, 50 second electrode pads 1A for each side of the semiconductor pellet 2; and the second area is provided with, for instance, 50 second electrode pads 1A for each side of the semiconductor pellet 2. Because the second electrode pads 1A cannot be made as small as the bonding pads 2A of the semiconductor pellet 2, the pitch of the second electrode pads 1A is set wider than that of the bonding pads 2A, for instance, at around 200 μm. That is, because the second electrode pads 1A of the base substrate 1 are arranged in two rows for each side of the semiconductor pellet 2, the length of the second electrode pads 1A corresponding to one side of the semiconductor pellet 2 can be made almost equal to that of the bonding pads 2A arranged along one side of the semiconductor pellet 2 even if the pitch of the second electrode pads 1A of the base substrate 1 is set to two times that of the bonding pads 2A of the semiconductor pellet 2. Furthermore, the second electrode pads 1A of the base substrate 1 can be located at positions facing the corresponding bonding pads 2A of the semiconductor pellet 2.

The peripheral area of the main surface of the base substrate 1 excluding the pellet mounting area is covered with a resin sealing body 7, which seals the bonding wires 6. That is, the resin sealing body 7 is formed on the main surface side and the back surface side of the base substrate 1. The resin sealing body 7 is made from epoxy resin 7A containing a phenol-base hardener, silicone rubber and filler for reducing stresses.

The back of the base substrate 1 facing the main surface of the semiconductor pellet 2 is exposed from the resin sealing body 7 that covers the peripheral area of the base substrate 1.

Figure 5:
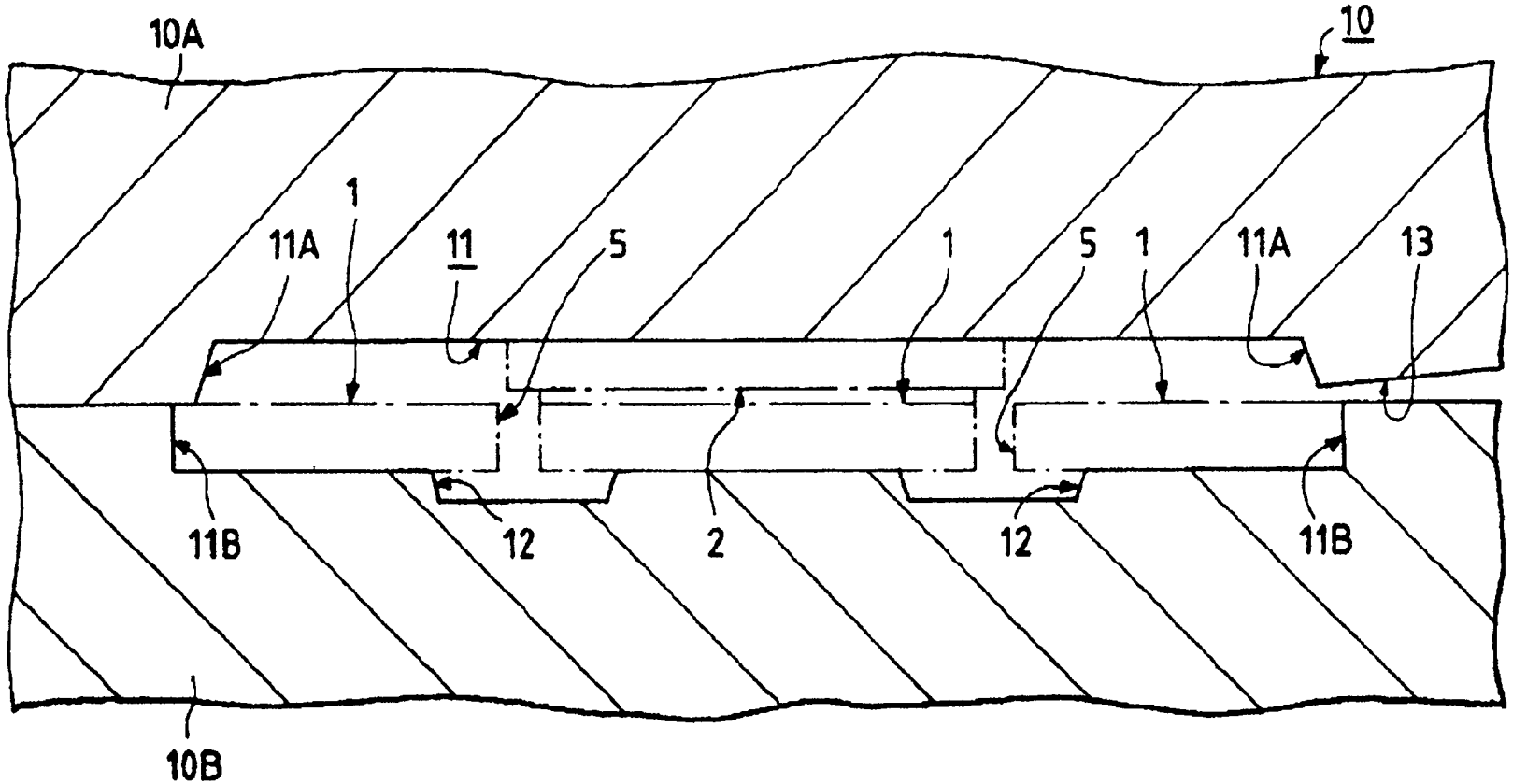
FIG. 5 is a cross section snowing an essential part of a molding die for the resin sealing body of the semiconductor device.

The resin sealing body 7 is formed by the transfer molding that uses a molding die 10 shown in FIG. 5 (cross section of an essential part). The molding die 10 has a cavity 11 defined by an upper die 10A and a lower die 10B, an inflow gate 13 connected to the cavity 11, and, though not shown, a pot and a runner. The pot communicates with the cavity 11 through the runner and the inflow gate 13.

The cavity 11 comprises a recess 11A formed in the upper die 10A and a recess 11B formed in the lower die 10B. The resin 7A is supplied into the recess 11A from the pot through the runner and the inflow gate 13. The base substrate 1 is placed in the recess 11B.

The recess 11B is formed with recesses 12, which are located at positions facing the slits 5 of the base substrate 1 and which extend in the same directions as the slits 5. Placed in the recesses 12 are a part of bonding wires 6 electrically connecting the bonding pads 2A of the semiconductor pellet 2 and the second electrode pads 1A of the base substrate 1, and also the second electrode pads 1A of the base substrate 1. The resin 7A is supplied from the recess 11A through the slits 5 of the base substrate 1 into the recess 11A.

Figure 12:
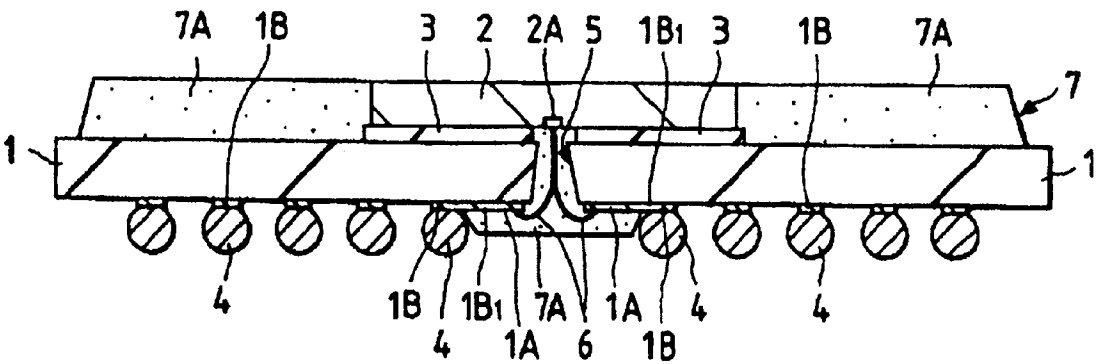
FIG. 12 is a cross section of the semiconductor device, as a second embodiment of this invention, that employs the BGA structure.

Though not shown in FIG. 12, the recesses 12 are provided with a gas vent to prevent voids due to bubbles.

Next, the method of manufacturing the above-mentioned semiconductor device is described by referring to FIGS. 6 through FIG. 9.

First, a base substrate 1 made of a rigid substrate is prepared. The base substrate 1 includes slits 5 as well as second electrode pads 1A, first electrode pads 1B and conductors $1B_1$ on its back.

Figure 6:
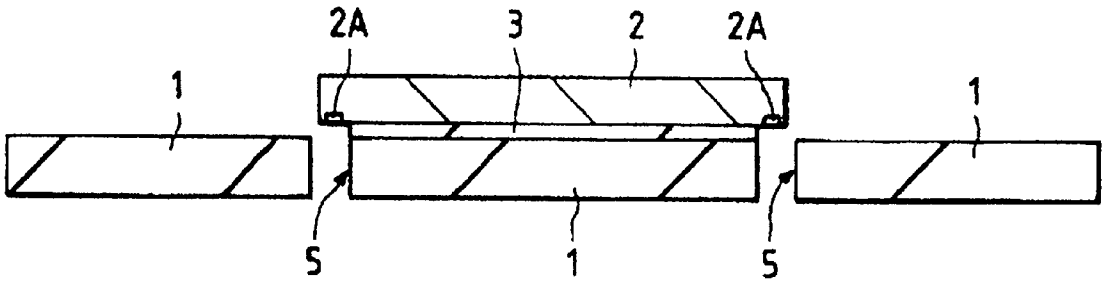
FIG. 6 is a cross section showing the method of manufacturing the semiconductor device.

Next, as shown in FIG. 6 (cross section), the semiconductor pellet 2 is mounted on the pellet mounting area of the main surface of the base substrate 1. The semiconductor pellet 2 is fixed to the pellet mounting area of the main surface of the base substrate 1 through an insulating layer 3.

Next, the base substrate 1 is mounted on a bonding stage (heat block) 14 with the semiconductor pellet 2 at the bottom. The bonding stage 14 has a recess 14A that accommodates the semiconductor pellet 2. The base substrate 1 and the semiconductor pellet 2 are heated to about 200° C. on the bonding stage 14.

Figure 7:
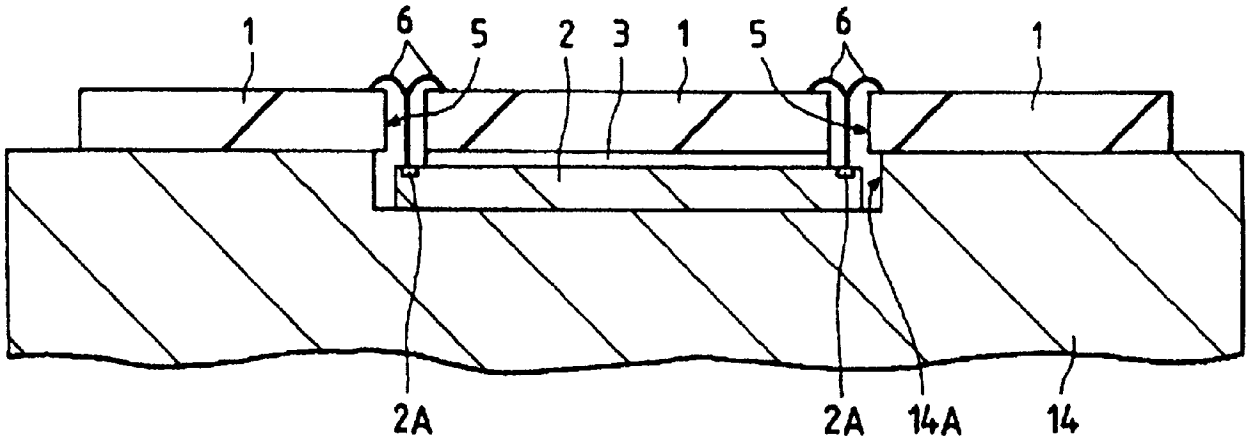
FIG. 7 is a cross section of an essential part of the semiconductor device showing the method of manufacture thereof.

Next, as shown in FIG. 7 (cross section of an essential part), the bonding pads 2A arranged on the main surface of the semiconductor pellet 2 and the second electrode pads 1A arranged on the back of the base substrate 1 are electrically connected by the bonding wires 6. The bonding wires 6 running in the slits 5 are connected to the bonding pads 2A of the semiconductor pellet 2 and to the second electrode pads 1A of the base substrate 1. The connection of the bonding wires 6 is accomplished by ultrasonic thermocompression bonding. In this process, the base substrate 1 is made from a rigid substrate with a high Young's modulus compared with the flexible substrate used in conventional structure, so that the bonding force applied to the second electrode pads 1A is prevented from being absorbed by the rigid base substrate 1, thus allowing the bonding force and the ultrasonic vibrations to be transferred effectively to the second electrode pads 1A. Further, because the base substrate 1 is made of a rigid substrate that has a smaller thermal expansion coefficient in the planar direction than that of a flexible substrate and a higher Young's modulus—which means it is harder to bend—it is possible to reduce positional deviations of the second electrode pads 1A and of the bonding pads 2A of the semiconductor pellet 2 due to thermal expansion of the base substrate 1.

Figure 8:
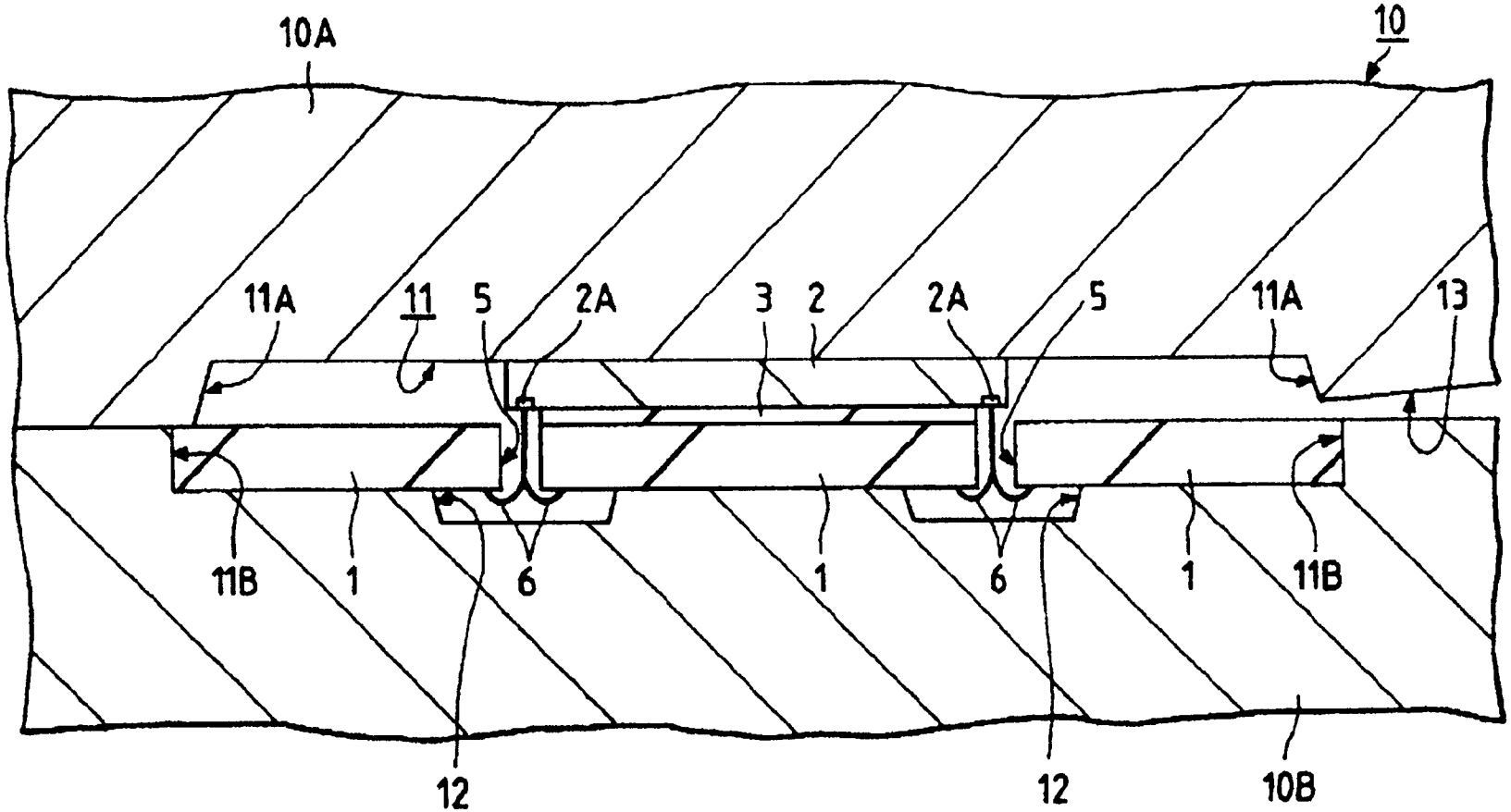
FIG. 8 is a cross section of an essential part of the semiconductor device showing the method of manufacture thereof.
Figure 9:
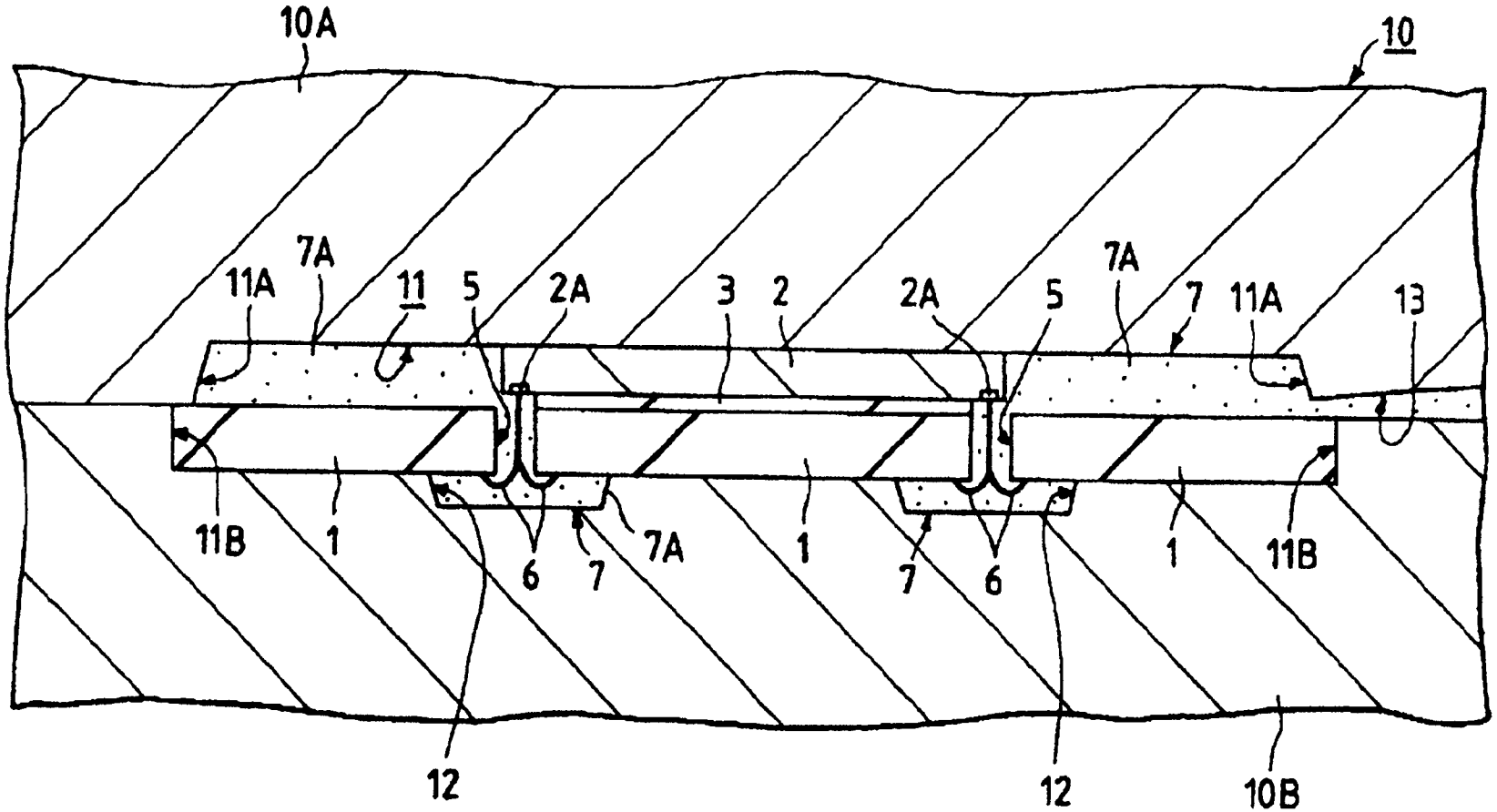
FIG. 9 is a cross section of an essential part of the semiconductor device showing the method of manufacture thereof.

Then, as shown in FIG. 8 (cross section of an essential part), the base substrate 1 and the semiconductor pellet 2 are put in the cavity 11 defined by the upper die 10A and the lower die 10B of the molding die 10, with the base substrate 1 fit in the recess 11B of the cavity 11. A part of the bonding wires 6 and the second electrode pads 1A of the base substrate 1 are placed in the recesses 12 formed in the recess 11B. The molding die 10 is preheated to around 170°–180° C. to heighten the fluidity of the resin 7A supplied into the cavity 11. Because the base substrate 1 is made from a rigid substrate with a smaller thermal expansion coefficient in the planar direction than the flexible substrate and with a higher Young's modulus, which means the base substrate 1 is harder to bend, the base substrate 1 can be prevented from being deformed (warped or twisted) due to the heating of the molding die 10 to about 170°–180° C. during this process.

Next, resin tablets are charged into the pot of the molding die 10, nothing that they are preheated by a heater to lower the viscosity before being charged. The resin tablets in the pot are heated by the molding die 10, further lowering the viscosity.

The resin is then pressurized by a plunger of the transfer molding device, forcing the resin 7A from the pot through the runner and the gate 13 into the recess 11A and the recesses 12 of the cavity 11 to cover the peripheral area of the main surface of the base substrate 1, leaving the back of the semiconductor pellet 2 exposed. In this way, a resin sealing body 7 that seals the bonding wires 6 is formed. The resin 7A is forced into the recesses 12 through the slits 5 of the base substrate 1 from the recess 11A. In this process, the resin 7A supplied from the recess 11A to the recesses 12 through the slits 5 flows in the axial direction of the bonding wires 6, i.e., in the vertical direction, from one end side of the bonding wires 6. This vertical flow of resin prevents the bonding wires 6 from being deformed whereas the horizontal flow along the surface of the base substrate 1 may deform them.

Then, the base substrate 1 is taken out of the molding die 10, and bump electrodes 4 are electrically and mechanically connected to the surfaces of the first electrode pads 1B on the back of the base substrate 1. Thus, a nearly completed semiconductor device shown in FIG. 1, 2, 3 and 4 is obtained.

Figure 10:
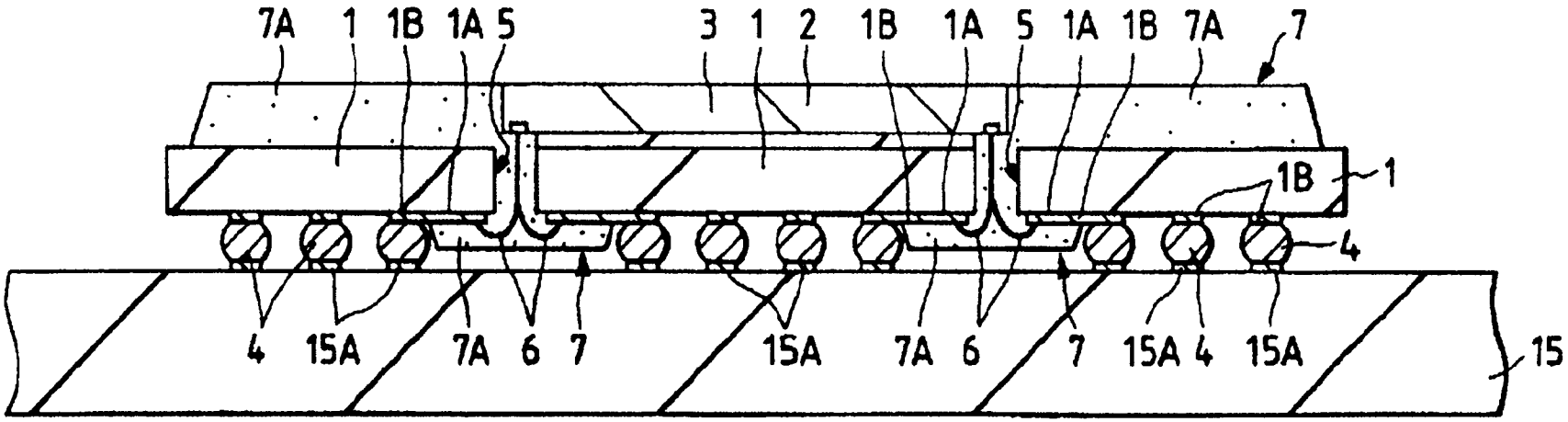
FIG. 10 is a cross section showing an essential part of the semiconductor device mounted on a mounting board.

After this, the semiconductor device is shipped as a product. The semiconductor device shipped as a product is mounted on a mounting surface of a mounting board 15, with the bump electrodes 4 of the semiconductor device electrically and mechanically connected to electrode pads 15A arranged on the mounting surface of the mounting board 15, as shown in FIG. 10 (cross section). The connection between the bump electrodes 4 of the semiconductor device and the electrode pads 15A of the mounting board 15, although it depends on the material of the bump electrodes 4, may be accomplished in an atmosphere at a reflow temperature of, for instance, around 210°–230° C. In this mounting process, because the base substrate 1 is made from a rigid substrate which has a smaller thermal expansion coefficient in the planar direction and a higher Young's modulus—which means it is more difficult to bend—than a flexible substrate, the base substrate 1 can be prevented from being deformed due to reflow heat.

This embodiment offers the following advantages.

A semiconductor device comprises a semiconductor pellet 2 mounted on a pellet mounting area of the main surface of a base substrate 1, in which first electrode pads 1B arranged on the back of the base substrate 1 are electrically connected to bonding pads 2A arranged on the main surface of the semiconductor pellet 2. The base substrate 1 is formed of a rigid substrate, and its first electrode pads 1B are electrically connected to the second electrode pads 1A arranged on its reverse side. The semiconductor pellet 2 is mounted on the pellet mounting area of the main surface of the base substrate 1, with its main surface downward, and its bonding pads 2A are electrically connected with the second electrode pads 1A of the base substrate 1 through bonding wires 6 passing through slits 5 formed in the base substrate 1. Because with this construction the bonding pads 2A of the semiconductor pellet 2 and the first electrode pads 1B of the base substrate 1 can be electrically connected through the bonding wires 6 and second electrode pads 1A, it is possible to eliminate the through holes used to electrically connect the second electrode pads 1A and the first electrode pads 1B. This in turn allows the base substrate 1 to be reduced in size by an amount corresponding to the occupied area of the through holes (land area), which contributes to size reduction of the semiconductor device.

Because the first electrode pads 1B can be put closer to the second electrode pads 1A by a distance corresponding to the occupied area of the through holes, it is possible to shorten the length of the conductors 1B, of the base substrate 1 that electrically connect the second electrode pads 1A and the first electrode pads 1B. This reduces the inductance, increasing the operation speed of the semiconductor device.

Further, because the rigid substrate has a higher Young's modulus and is harder than the flexible substrate of the conventional structure, the bonding force applied to the second electrode pads 1A is not absorbed by the base substrate 1 when electrically connecting the bonding pads 2A on the main surface of the semiconductor pellet 2 and the second electrode pads 1A on the back of the base substrate 1 by the bonding wires 6. As a result, the bonding force and the ultrasonic vibrations are effectively transferred to the second electrode pads 1A. This in turn increases the connection strength between the bonding wires 6 and the second electrode pads 1A, preventing possible connection failures of the bonding wires 6, enhancing the electric reliability of the semiconductor device.

Moreover, because the rigid substrate has a smaller thermal expansion coefficient in the planar direction and a higher Young's modulus than a flexible substrate, which means it is more resistant to bending, the base substrate 1 is free from deformations (warping and twisting) due to reflow heat when the semiconductor device is mounted on the mounting surface of the mounting board 15. As a result, a sufficient degree of flatness of the back of the base substrate 1 with respect to the mounting surface of the mounting board 15 can be secured, enhancing the mounting precision of the semiconductor device.

Further, because the rigid substrate has a smaller thermal expansion coefficient in the planar direction and a higher Young's modulus than the flexible substrate, which means it is more resistant to bending, the warping of the base substrate 1 can be limited to less than 100 μm even when the external size of the base substrate 1 increases with the increasing number of the first electrode pads 1B.

With the warping of the base substrate 1 limited to within 100 μm, it is possible to eliminate a reinforcement substrate intended to prevent warping of the base substrate 1. This reduces the manufacture cost of the semiconductor device compared with that of a semiconductor device having a reinforcement substrate.

Furthermore, because the base substrate 1 can be formed of a printed wiring board of a single layer structure having the second electrode pads 1A, first electrode pads 1B and conductors $1B_1$ arranged only on the back of a rigid substrate, the parts cost of the base substrate 1 can be reduced compared with that of a base substrate formed of a two-layer printed wiring board which has circuits formed on both the main and back surfaces of the rigid substrate. This means that the overall cost of semiconductor device manufacture can be lowered.

Another feature of this embodiment is that the slits 5 formed in the base substrate 1 extend in the directions of rows of bonding pads 2A arranged on the main surface of the semiconductor pellet 2 and are located at positions over the bonding pads 2A. With this construction, the slits 5 are arranged within the area occupied by the semiconductor pellet 2, so that the base substrate 1 requires no increase in size corresponding to the slits 5.

A further feature of this embodiment is that the second electrode pads 1A are arranged in two opposite areas of the back of the base substrate 1 divided by the slits 5. This construction allows an increase in the number of power supply paths for electrically connecting the bonding pads 2A of the semiconductor pellet 2 and the second electrode pads 1A of the base substrate 1. This in turn makes it possible to reduce power supply noise generated at time of simultaneous switching of signals, thereby preventing malfunctions of the semiconductor device.

Further, even when the pitch of the second electrode pads 1A of the base substrate 1 is set larger than that of the bonding pads 2A of the semiconductor pellet 2, the length of the row of the second electrode pads 1A for each side of the semiconductor pellet 2 can be made almost equal to the length of the row of the bonding pads 2A for each side of the semiconductor pellet 2. This prevents an increase in the length of the bonding wires 6, which is dependent on the length of the row of the second electrode pads 1A. As a result, it is possible to prevent the bonding wires 6 from being deformed by the flow of resin when the bonding wire 6 are sealed by the resin sealing body 7 according to the transfer molding.

Further, because the second electrode pads 1A can be located at positions on the base substrate 1 facing the bonding pads 2A of the semiconductor pellet 2, the lengths of the bonding wires 6 can be made uniform, which in turn makes uniform the inductances of the signal paths between the bonding pads 2A of the semiconductor pellet 2 and the second electrode pads 1A of the base substrate 1.

A further feature of this embodiment is the structure in which the back of the semiconductor pellet 2 opposing its main surface is exposed from the resin sealing body 7 that covers the peripheral area around the main surface of the base substrate 1. This structure allows the heat generated by the operation of the circuit system mounted on the semiconductor pellet 2 to be released from the back of the semiconductor pellet 2, thus enhancing the heat dissipation efficiency of the semiconductor device.

Further, because the mechanical strength of the base substrate 1 can be reinforced by the mechanical strength of the resin sealing body 7, deformations of the base substrate 1 (warping and twisting) due to reflow heat during mounting can be prevented.

A further feature of this embodiment is that the bonding wires 6 are sealed with the resin sealing body 7. This structure prevents the bonding wires 6 from being deformed due to external impacts and contacts, thus enhancing the electric reliability of the semiconductor device.

A still further feature of this embodiment is that the resin sealing body 7 is formed both on the main surface side and the back surface side of the base substrate 1. This structure prevents the resin sealing body 7 from becoming separated from the base substrate 1 due to the thermal stresses generated during a temperature cycle test or when the bump electrodes 4 are connected. This in turn enhances the reliability of the semiconductor device.

A method of manufacturing a semiconductor device, in which a semiconductor pellet 2 is mounted on a pellet mounting area of the main surface of a base substrate 1 and in which first electrode pads 1B arranged on the back of the base substrate 1 are electrically connected to bonding pads 2A arranged on the main surface of the semiconductor pellet 2, comprises a step of mounting the semiconductor pellet 2, with its main surface downward, on the pellet mounting area of the main surface of the base substrate 1 formed of a rigid substrate, and a step of electrically connecting the bonding pads 2A to the second electrode pads 1A, which are electrically connected to the first electrode pads 1B of the base substrate 1 and arranged on the back of the base substrate 1, through bonding wires 6 passing through slits 5 formed in the base substrate 1. The bonding pads 2A of the semiconductor pellet 2 and the first electrode pads 1B of the base substrate 1 therefore are electrically connected through the bonding wires 6 and the second electrode pads 1A, so that through holes 1C used for electrically connecting the second electrode pads 1A and the first electrode pads 1B can be eliminated, reducing the external size of the base substrate 1 by an amount corresponding to the occupied area of the through holes. As a result, the overall external size of the semiconductor device can be reduced.

Further, because the bonding pads 2A of the semiconductor pellet 2 and the first electrode pads 1B of the base substrate 1 are electrically connected through the bonding wires 6 and the second electrode pads 1A, there is no need for through holes 1C to electrically connect the second electrode pads 1A with the first electrode pads 1B. This makes it possible to use a base substrate 1 in which the conductors $1B_1$ electrically connecting the second electrode pads 1A and the first electrode pads 1B are shorter by a length corresponding to the occupied area of the through holes. As a result it is possible to fabricate a semiconductor device with fast operating speeds.

Because the base substrate 1 used is formed of a rigid substrate having a higher Young's modulus—which means it is harder—than a flexible substrate, the bonding force applied to the bonding pads 2A when electrically connecting the bonding pads 2A arranged on the main surface of the semiconductor pellet 2 and the second electrode pads 1A arranged on the back of the base substrate 1 through the bonding wires 6 is not absorbed by the base substrate 1, effectively transmitting the bonding force and ultrasonic vibrations to the second electrode pads 1A. As a result, the connection strength between the bonding wires 6 and the second electrode pads 1A can be increased, which in turn allows the manufacture of a semiconductor device with high electric reliability.

Because the base substrate 1 is formed of a rigid substrate having a smaller thermal expansion coefficient in the planar direction and a higher Young's modulus—which means it is more resistant to bending—than a flexible substrate, the base substrate 1 is prevented from being deformed (warped or twisted) due to reflow heat during the process of mounting the semiconductor device on the mounting surface of the mounting board 15. This allows the back surface of the base substrate 1 to have a sufficient degree of Harness with respect to the mounting surface of the mounting board 15, thus enhancing the mounting precision of the semiconductor device.

Following the process of electrically connecting with the bonding wires 6, the method of manufacture includes a process of transfer molding of a resin sealing body 7 that covers the peripheral area of the main surface of the base substrate 1 and seals the bonding wires 6. Because the base substrate 1 uses a rigid substrate which has a smaller thermal expansion coefficient in the planar direction and a higher Young's modulus and is more resistant to beading than a flexible substrate, this method prevents the base substrate 1 from being deformed (warped or twisted) due to heating of the molding die 10.

Because the resin 7A supplied from the recess 11A into the recesses 12 through the slits 5 flows from one end side of the bonding wires 6 in their axial direction, i.e., in the vertical direction, the bonding wires 6 are not deformed by the flow of the resin 7A, whereas they can be deformed when the resin flows along the surface of the base substrate 1, i.e., in the lateral direction.

Figure 11:
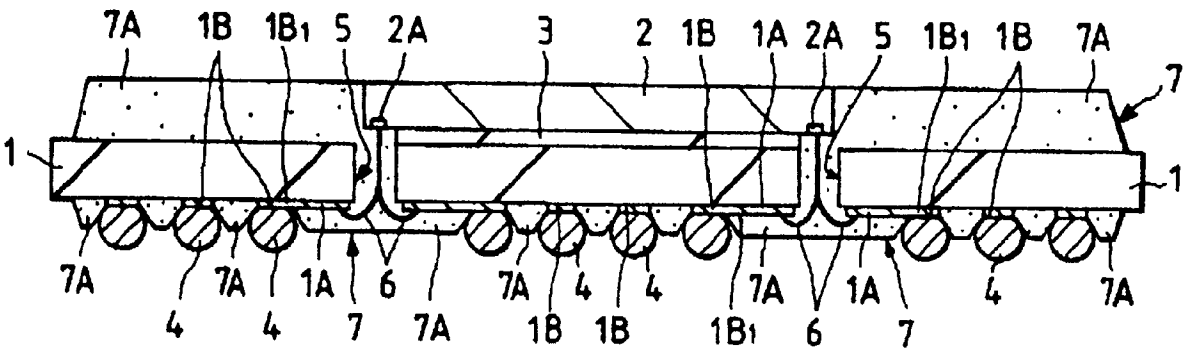
FIG. 11 is a cross section showing a variation of the semiconductor device.

As shown in FIG. 11 (cross section), the resin sealing body 7 may be formed on the back surface of the base substrate 1 excluding the surfaces of the second electrode pads 1A and first electrode pads 1B. In this case, the base substrate 1 is held and clamped from both sides by the resin sealing body 7 and therefore prevented from being warped.

The base substrate 1 may, though not shown, be formed in a multilayer structure in which a plurality of rigid substrates are stacked together. This structure can reduce the manufacture cost as compared with a base substrate made up of a plurality of flexible substrates stacked together.

Embodiment 2

Figure 13:
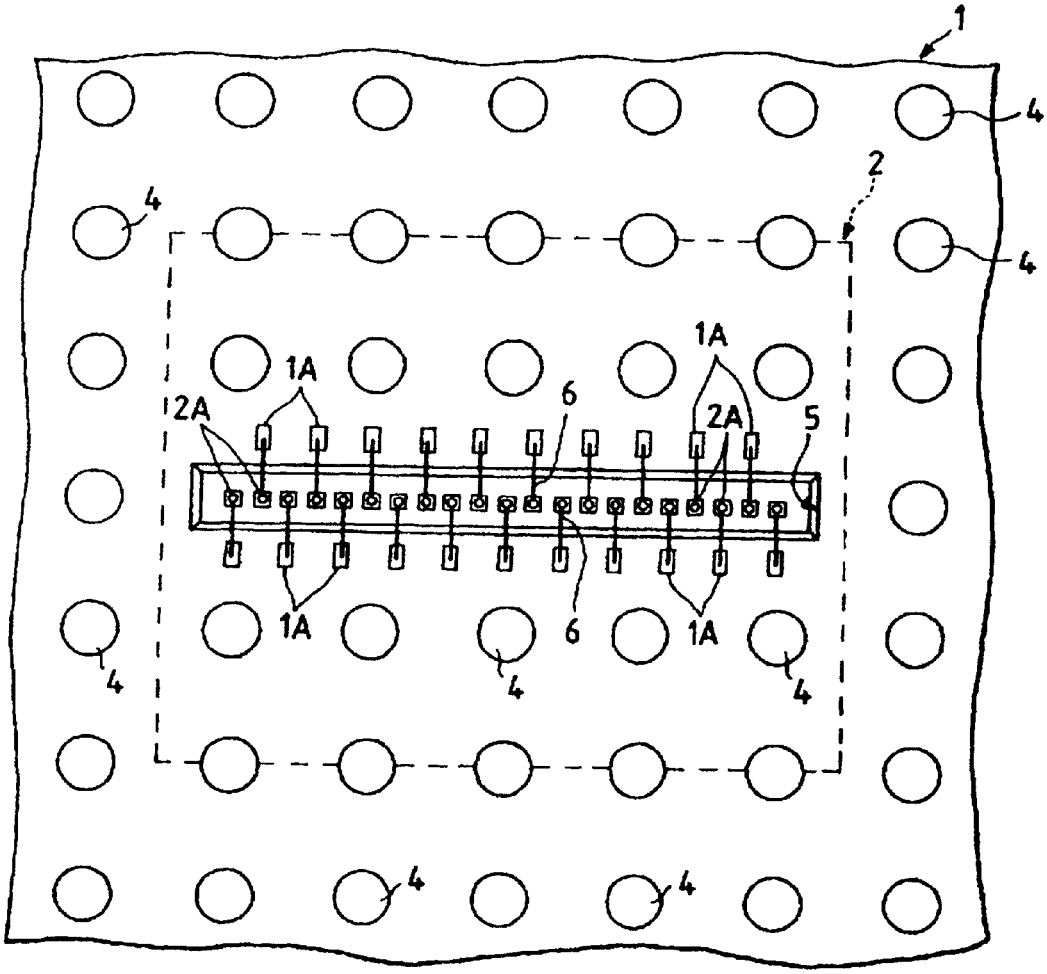
FIG. 13 is an enlarged plan view showing the state of the back side of an essential part of the semiconductor device with the resin sealing body removed.

The outline configuration of a semiconductor device as the second embodiment of this invention that employs a BGA structure is shown in FIG. 12 (cross section) and FIG. 13 (enlarged plan view of an essential part of the back side showing the state of the back side removed of the resin sealing body).

As shown in FIG. 12 and 13, the semiconductor device has the semiconductor pellet 2 mounted facedown on the pellet mounting area of the main surface of the base substrate 1 with an insulating layer 3 in between. A plurality of bump electrodes 4 are arranged in grid on the back of the base substrate 1.

Arranged in the central area of the main surface of the semiconductor pellet 2 along the longer sides thereof is a row of bonding pads 2A, which are electrically connected to the second electrode pads 1A arranged on the back of the base substrate 1 through the bonding wires 6 passing through the slits 5 formed in the base substrate 1. The second electrode pads 1A are electrically connected to the corresponding first electrode pads 1B arranged on the back of the base substrate 1 through conductors $1B_1$. Bump electrodes 4 are electrically and mechanically connected to the surfaces of the first electrode pads 1B. That is, the bonding pads 2A of the semiconductor pellet 2 are electrically connected to the first electrode pads 1B through the bonding wires 6, second electrode pads 1A and conductors $1B_1$.

The slits 5 of the base substrate 1 are formed in the central area of the main surface of the semiconductor pellet 2 along the direction of the row of the bonding pads 2A arranged along the longer side of the semiconductor pellet 2. The slits 5 are tapered so that its opening on the back side of the base substrate 1 is greater than the opening on the main surface side.

As described above, this embodiment offers similar effects and advantages to those of the first embodiment. With the slits 5 tapered, it is possible to prevent contact between the base substrate 1 and a bonding tool when one end of the bonding wires 6 is bonded to the bonding pads 2A of the semiconductor pellet 2. This in turn raises the yield of semiconductor device assembly in the bonding process.

Embodiment 3

Figure 14:
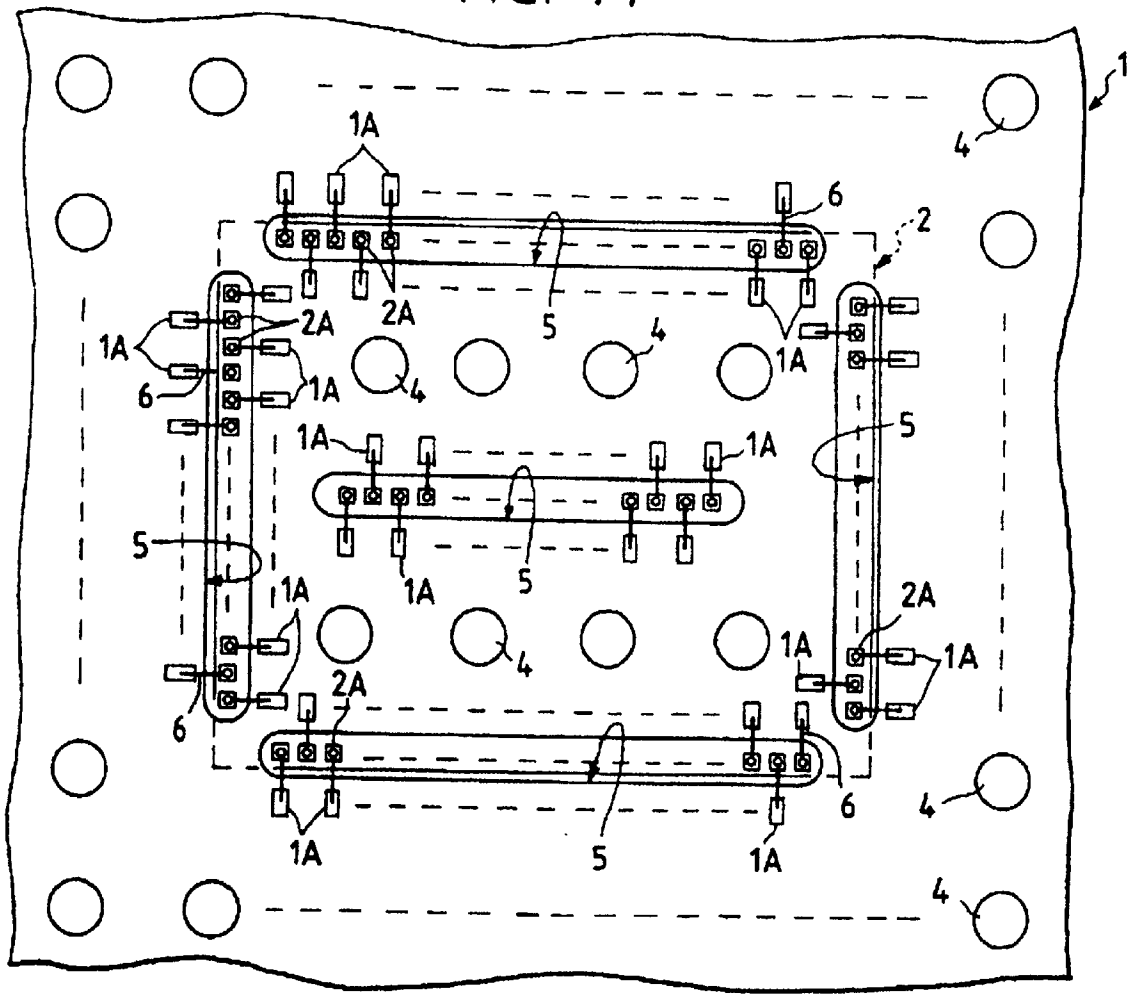
FIG. 14 is a plan view showing the state of the back side of an essential part of the semiconductor device, as a third embodiment of this invention, that employs the BGA structure with the resin sealing body removed.

The outline configuration of a semiconductor device as the third embodiment of this invention that employs a BGA structure is shown in FIG. 14 (plan view of an essential part of the back side showing the state of the back side removed of the resin sealing body).

As shown in FIG. 14, the semiconductor device has a semiconductor pellet 2 mounted facedown on a pellet mounting area of the main surface of the base substrate 1, with an insulating layer 3 in between. Bump electrodes 4 are arranged in grid on the back of the base substrate 1.

At the outer periphery of the main surface of the semiconductor pellet 2, a plurality of bonding pads 2A are arranged along the sides of the pellet. At the central portion of the main surface of the semiconductor pellet 2, a plurality of bonding pads 2A are arranged along the longer or shorter side of the pellet. The bonding pads 2A are electrically connected to the second electrode pads 1A arranged on the back of the base substrate 1 by bonding wires 6 passing through slits 5 formed in the base substrate 1. The second electrode pads 1A are electrically connected to first electrode pads 1B arranged on the back of the base substrate 1 through conductors $1B_1$. Bump electrodes 4 are electrically and mechanically connected to the surfaces of the individual first electrode pads 1B. That is, the bonding pads 2A are electrically connected to the first electrode pads 1B through the bonding wires 6, second electrode pads 1A and conductors $1B_1$.

The slits 5 are arranged at each sides of the semiconductor pellet 2 and also at the central portion of the pellet. That is, the base substrate 1 of this embodiment has five slits 5, each of which is located above the bonding pads 2A of the semiconductor pellet 2.

As explained above, this embodiment offers the similar effects and advantages to those of the first embodiment. Because the slits 5 are arranged at the sides and the central portion of the semiconductor pellet 2, it is possible to increase the number of bonding pads 2A arranged on the main surface of the semiconductor pellet 2 and the number of second electrode pads 1A arranged on the back of the base substrate 1. This allows an increase in the number of power supply paths for electrically connecting the bonding pads 2A of the semiconductor pellet 2 and the second electrode pads 1A of the base substrate 1. This is turn allows a further reduction in power supply noise generated when output signals are switched simultaneously. Furthermore, this construction makes it possible to increase the number of signal paths electrically connecting the bonding pads 2A of the semiconductor pellet 2 and the second electrode pads 1A of tho base substrate 1 and therefore reduce the external size of the semiconductor pellet 2 dictated by the number of bonding pads 2A.

Although this embodiment has been shown to have only one slit 5 formed at the central portion of the semiconductor pellet 2, two or more slits 5 may be arranged parallelly or crosswise to each other at the central part of the semiconductor pellet 2. By increasing the number of slits 5 in this way, it is possible to further increase the number of the second electrode pads 1A of the base substrate 1 and the number of the bonding pads 2A of the semiconductor pellet 2.

Embodiment 4

Figure 15:
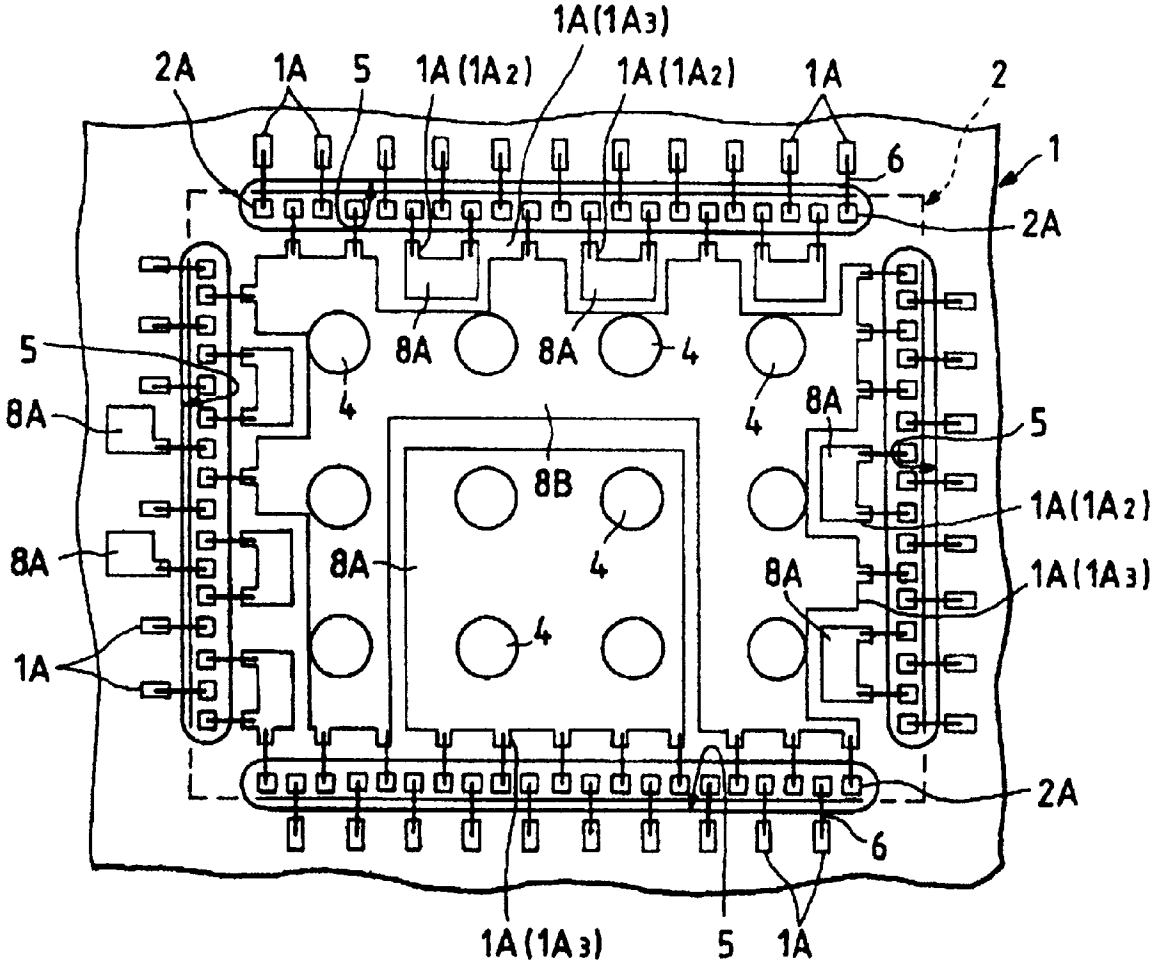
FIG. 15 is a plan view showing the state of the back side of an essential part of the semiconductor device, as a fourth embodiment of this invention, that employs the BGA structure and is removed of the resin sealing body removed.
Figure 16:
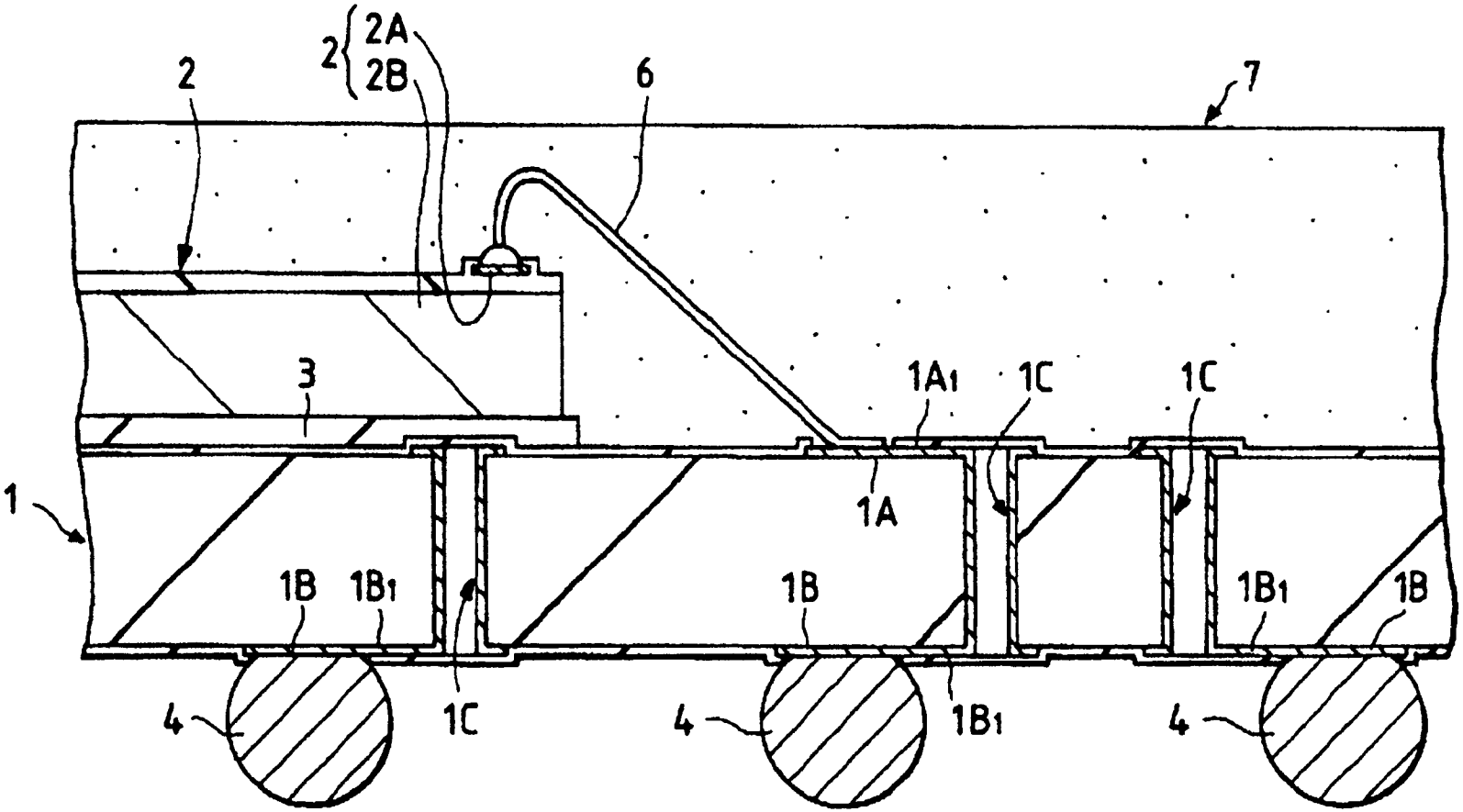
FIG. 16 is a cross section showing an essential part of the semiconductor device that employs the conventional BGA structure.

The outline configuration of a semiconductor device as the fourth embodiment of this invention that employs a BGA structure is shown in FIG. 15 (plan view of an essential part of the back side showing the state of the back side removed of the resin sealing body).

As shown in FIG. 15, the semiconductor device has a semiconductor pellet 2 mounted facedown on a pellet mounting area of the main surface of the base substrate 1, with an insulating layer 3 in between. Bump electrodes 4 are arranged in grid on the back of the base substrate 1. The base substrate 1 is formed of a printed circuit board of, for example, 3-layer wiring structure.

At the outer periphery of the main surface of the semiconductor pellet 2, a plurality of bonding pads 2A are arranged along the sides of the pellet. The bonding pads 2A are electrically connected to the second electrode pads 1A arranged on the back of the base substrate 1 through bonding wires 6 passing through slits 5 formed in the base substrate 1.

Of the second electrode pads 1A, electrode pads $1A_2$ are formed integral with electrode plates 8A. The electrode plates 8A are electrically connected to other electrode plates 8A via through holes (not shown) and internal wiring (not shown) in the base substrate 1. The electrode plates 8A is connected to be at a reference voltage (0 V for example). Of the second electrode pads 1A, electrode pads $1A_3$ are formed integral with an electrode plate 8B. This electrode plate 8A is connected to be at an operating, voltage (3.3 V for instance).

With this embodiment, because the through holes 1C that electrically connect the second electrode pads 1A on the main surface of the base substrate 1 and the first electrode pads 1B on the back are eliminated, the electrode plates 8A and the electrode plate 8B can be arranged on the back of the base substrate 1. This allows the bump electrodes 4 to be freely located and shortens the distance between the bonding pads 2A of the semiconductor pellet 2 and the pump electrodes 4. As a result, the inductance can be reduced, thereby increasing the operating speeds of the semiconductor device.

The invention has been described in detail in connection with representative embodiments of the invention. It is noted, however, that the invention is not limited to these embodiments but that many modifications may be made without departing from the spirit of the invention.

Representative advantages of this invention may be summarized as follows.

It is possible to reduce the size of a semiconductor device in which the semiconductor pellet is mounted on the pellet mounting area of the main surface of the base substrate and in which the first electrode pads arranged on the back of the base substrate are electrically connected to the bonding pads arranged on the main surface of the semiconductor pellet.

It is possible to increase the operating speed of the semiconductor device.

It is also possible to enhance the electric reliability of the semiconductor device.

Further, it is possible to increase the mounting precision of the semiconductor device.

What is claimed is:

[1. A semiconductor device comprising:

(a) a rigid substrate having a first main surface and a second main surface opposite to the first main surface;

(b) a semiconductor pellet mounted on the first main surface of the rigid substrate, the semiconductor pellet having a plurality of semiconductor circuit elements and a plurality of bonding pads;

(c) a plurality of electrode pads formed on the second main surface of the rigid substrate; and (d) a plurality of bonding wires for electrically connecting the bonding pads of the semiconductor pellet with the electrode pads;

wherein the semiconductor pellet is mounted facedown on the rigid substrate, the rigid substrate has slits that extend from the first main surface to the second main surface and expose the bonding pads of the semiconductor pellet, the bonding wires extend through the slits in the rigid substrate to connect the bonding pads and the electrode pads, and bump electrodes are formed on said electrode pads.]

[2. A semiconductor device according to claim 1, wherein the bonding pads are arranged at the periphery of the semiconductor pellet and the slits are formed along the directions of rows of the bonding pads.]

[3. A semiconductor device according to claim 2, wherein the electrode pads are located on both sides of the slits.]

[4. A semiconductor device according to claim 3, wherein the electrode pads located on one side of the slits and under the semiconductor pellet are power supply pads, and the electrode pads located on the other side of the slits and outside the semiconductor pellet are signal pads.]

[5. A semiconductor device according to claim 1, further comprising a first resin sealing body covering the semiconductor pellet.]

[6. A semiconductor device according to claim 5, further comprising a second resin sealing body formed in the slits and covering the bonding wires.]

[7. A semiconductor device according to claim 1, wherein said rigid substrate is formed by glass fibers impregnated with epoxy resin.]

[8. A method of manufacturing a semiconductor device in which a semiconductor pellet is mounted on a pellet mounting area of the main surface of a rigid base substrate and in which first electrode pads arranged on the back of the rigid base substrate are electrically connected to bonding pads arranged on the main surface of the semiconductor pellet, said method comprising:

a step of mounting the semiconductor pellet with its main surface downward, on the pellet mounting area of the main surface of the rigid base substrate a step of electrically connecting the bonding pads of the semiconductor pellet and second electrode pads electrically connected to the first electrode pads of the rigid base substrate and arranged on the back of the rigid base substrate through bonding wires passing through slits formed on the rigid base substrate; and a step of forming bump electrodes on the first electrode pads.]

[9. A method of manufacturing a semiconductor device according to claim 9, further comprising a step of forming by transfer molding a resin sealing body that covers the periphery of the main surface of the rigid base substrate and seals the bonding wires, after the step of electrically connecting the bonding wires.]

[10. A semiconductor device according to claim 10, wherein said rigid substrate is formed by glass fibers impregnated with polyimide resin.]

[11. A semiconductor device comprising:

(a) a rigid substrate having a first main surface and a second main surface opposite to the first main surface;

(b) a semiconductor pellet mounted on the first main surface of the rigid substrate, the semiconductor pellet having a plurality of semiconductor circuit elements and a plurality of bonding pads;

(c) a plurality of electrode pads formed on the second main surface of the rigid substrate; and (d) a plurality of bonding wires for electrically connecting the bonding pads of the semiconductor pellet with the electrode pads;

wherein the semiconductor pellet is mounted facedown on the rigid substrate, the rigid substrate has slits that extend from the first main surface to the second main surface and expose the bonding pads of the semiconductor pellet, and the bonding wires extend through the slits in the rigid substrate to connect the bonding pads and the electrode pads;

wherein the bonding pads are arranged at the periphery of the semiconductor pellet and the slits are formed along the directions of rows of the bonding pads.]

[12. A semiconductor device according to claim 11, wherein the electrode pads are located on both sides of the slits.]

[13. A semiconductor device according to claim 12, wherein the electrode pads located on one side of the slits and under the semiconductor pellet are power supply pads, and the electrode pads located on the other side of the slits and outside the semiconductor pellet are signal pads.]

[14. A semiconductor device comprising:

a substrate of a quadrilateral shape having a first pair of opposed edges and a second pair of opposed edges, said substrate having a first main surface, a second main surface opposite to said first main surface and a first slit and a second slit each extending from said first main surface to said second main surface, said first slit extending along one of said first pair of opposed edges, said second slit extending along the other of said first pair of opposed edges, said substrate having first electrode pads on said second main surface in a first area between said first and second slits, second electrode pads on said second main surface in a second area between said first slit and said one of the first pair of opposed edges, and third electrode pads on said second main surface in a third area between said second slit and the other of the first pair of opposed edges;

a semiconductor pellet having a main surface with semiconductor elements and bonding pads, said semiconductor pellet being mounted on said first main surface of substrate such that said bonding pads are arranged to be in line with said first and second slits;

bonding wires extending through said first and second slits in said substrate and electrically connecting said bonding pads and said first to third electrode pads, respectively;

a resin member sealing said semiconductor pellet and said bonding wires; and bump electrodes arranged on said second main surface of said substrate in said first to third areas in a direction of said first pair of opposed edges and being electrically connected with said first to third electrode pads, wherein said bump electrodes in said second and third areas are arranged to form plural rows in a direction of at least one of said second pair of opposed edges, respectively.]

[15. A semiconductor device according to claim 14, wherein said semiconductor pellet has a quadrilateral shape and has a third pair of opposed edges and a fourth pair of opposed edges, wherein said bonding pads are arranged in a peripheral portion of said main surface and extend along said third pair of opposed edges.]

[16. A semiconductor device according to claim 15, wherein said semiconductor pellet is mounted on said first main surface opposite to said first area, wherein said substrate has a larger size than that of said semiconductor pellet, and wherein said bump electrodes in said second and third areas are located outside said third pair of opposed edges.]

[17. A semiconductor device according to claim 14, wherein the number of said bump electrodes in said second and third areas is larger than the number of said bump electrodes in said first area.]

[18. A semiconductor device according to claim 14, wherein said semiconductor pellet has a rear surface opposite to said main surface, and wherein said rear surface of said semiconductor pellet it exposed from said resin member.]

[19. A semiconductor device according to claim 14, wherein the number of said bump electrodes in said second area is larger than the number of said bump electrodes in said first area.]

[20. A semiconductor device according to claim 14, wherein said semiconductor pellet has a rear surface opposite to said main surface, and wherein said rear surface of said semiconductor pellet is exposed from said resin member.]

[21. A semiconductor device according to claim 14, wherein said first electrode pads extend along said first and second slits, respectively, said second electrode pads extend along said first slit, and said third electrode pads extend along said second slit wherein said first to third electrode pads are arranged at a first pitch, respectively, wherein said bonding pads in said first and second slits are arranged at a second pitch which is smaller than said first pitch, respectively, wherein said bending wires in said first slit alternately connect said bonding pads in said first slit with said first and second electrode pads, and wherein said bonding wires in said second slit alternately connect said bonding pads in said second slit with said first and third electrode pads.]

[22. A semiconductor device comprising:

a substrate of a quadrilateral shape having first to fourth edges, said substrate having a first main surface, a second main surface opposite to said first main surface and first to fourth slits extending from said first main surface to said second main surface, said first to fourth slits respectively extending along said first to fourth edges and defining a first area of said substrate surrounded by said first to fourth slits and a second area of said substrate extending outside said first to fourth slits, said substrate having first electrode pads on said second main surface in said first area and second electrode pads on said second main surface in said second area;

a semiconductor pellet having a main surface with semiconductor elements and bonding pads, said semiconductor pellet being mounted on said first main surface of substrate such that said bonding pads are arranged in line with said first to fourth slits;

bonding wires extending through said first to fourth slits in said substrate and electrically connecting said bonding pads and said first and second electrode pads, respectively;

a resin member sealing said semiconductor pellet and said bonding wires; and bump electrodes arranged on said second main surface of said substrate in said first and second areas and being electrically connected with said first and second electrode pads, wherein said bump electrodes in said second area are arranged to form a plurality of rows such that said plurality of rows are formed relative to one another to surround said first area of substrate.]

[23. A semiconductor device according to claim 22, wherein said semiconductor pellet has a quadrilateral shape and has first to fourth edges, wherein said bonding pads are arranged in a peripheral portion of said main surface and extend along said first to fourth edges of said semiconductor pellet.]

[24. A semiconductor device according to claim 23, wherein said semiconductor pellet is mounted on said first main surface opposite to said first area, wherein said substrate has a larger size than that of said semiconductor pellet, and wherein said bump electrodes in said second area are located outside said first to fourth edges of said semiconductor pellet.]

[25. A semiconductor device according to claim 22, wherein said first and second electrode pads extending along said first to fourth slits, respectively, and are arranged at a first pitch, wherein said bonding pads extend along said first and second electrode pads and are arranged at a second pitch which is smaller than said first pitch, and wherein said bonding wires alternately connect said bonding pads with said first and second electrode pads.]

*26. A semiconductor device comprising:*

*(1) a semiconductor pellet of a quadrilateral shape having bonding pads formed in a main surface thereof, said semiconductor pellet having a first pair of opposed edges extending in a first direction and a second pair of opposed edges extending in a second direction which intersects with said first direction, said bonding pads being arranged in said first direction to form a row of bonding pads;*

*(2) a substrate having a first surface, a second surface opposite to said first surface, electrode pads formed on said second surface and slit passing through said substrate from said first surface to said second surface and extending in said first direction, said substrate including a glass fiber and resin, said semiconductor pellet being disposed on said first surface of said substrate such that said main surface of said semiconductor pellet is faced to said first surface of said substrate and said row of bonding pads is arranged in said slit in a plane view, said electrode pads including first electrode pads arranged at one side of said slit and second electrode pads arranged at other side of said slit in said second direction;*

*(3) bonding wires electrically connecting said electrode pads of said substrate with said bonding pads of said semiconductor pellet via said slit, said bonding wires including first bonding wires connected to said first electrode pads and second bonding wires connected to said second electrode pads;*

*(4) bump electrodes disposed on said second surface of said substrate and electrically connected to said electrode pads of said substrate, said bump electrodes including first bump electrodes electrically connected to said first electrode pads and second bump electrodes electrically connected to said second electrode pads, said bump electrodes being arranged on said second surface of said substrate such that some of said bump electrodes overlap with said semiconductor pellet in said plane view respectively; and*

*(5) a resin sealing body sealing the whole of each of said bonding wires and said main surface of said semiconductor pellet exposed from said slit,*

*(6) wherein a height of said bump electrodes is greater than a thickness of said resin sealing body from said second surface of said substrate toward a top of said bump electrode in a thickness direction of said semiconductor pellet.*

*27. The semiconductor device according to claim 26, wherein said row of bonding pads is disposed at a substantially central area between said first pair of opposed edges of said semiconductor pellet.*

*28. The semiconductor device according to claim 27, wherein said semiconductor pellet has a rectangular shape, and wherein said first pair of opposed edges are corresponding to a pair of longer edges and said second pair of opposed edges are corresponding to a pair of shorter edges.*

*29. The semiconductor device according to claim 26, wherein said slit is tapered so that opening on said second surface of substrate is greater than opening on said first surface of said substrate.*

*30. The semiconductor device according to claim 26, wherein said bump electrodes are formed of a Pb-Sn alloy.*

*31. A semiconductor device comprising:*

*(1) a semiconductor pellet of a quadrilateral shape having bonding pads formed in a main surface thereof, said semiconductor pellet having a first pair of opposed edges extending in a first direction and a second pair of opposed edges extending in a second direction which intersects with said first direction, said bonding pads being arranged in said first direction;*

*(2) a substrate having a first surface, a second surface opposite to said first surface, electrode pads formed on said second surface and slit passing through said substrate from said first surface to said second surface and extending in said first direction, said substrate including a glass fiber and resin, said semiconductor pellet being disposed on said first surface of said substrate such that said main surface of said semiconductor pellet is faced to said first surface of said substrate and said bonding pads are arranged in said slit in a plane view, said electrode pads including first electrode pads arranged at one side of said slit and second electrode pads arranged at other side of said slit in said second direction, said bump electrodes being arranged on said second surface of said substrate such that some of said bump electrodes overlap with said semiconductor pellet in said plane view, respectively;*

*(3) bonding wires electrically connecting said electrode pads of said substrate with said bonding pads of said semiconductor pellet via said slit, said bonding wires including first bonding wires connected to said first electrode pads and second bonding wires connected to said second electrode pads;*

*(4) bump electrodes disposed on said second surface of said substrate and electrically connected to said electrode pads of said substrate, said bump electrodes including first bump electrodes electrically connected to said first electrode pads and second bump electrodes electrically connected to said second electrode pads, said first and second bump electrodes being arranged to overlap with said semiconductor pellet in said plane view respectively; and*

*(5) a resin sealing body sealing the whole of each of said bonding wires and said main surface of said semiconductor pellet exposed from said slit,*

*(6) wherein a height of said bump electrodes is greater than a thickness of said resin sealing body from said second surface of said substrate toward a top of said bump electrode in a thickness direction of said semiconductor pellet, and*

*(7) wherein a portion of each of said first and second electrode pads with where each of said first and second bonding wires is connected is arranged between said slit and said first and second bump electrodes, respectively.*

*32. The semiconductor device according to claim 31, wherein said bonding pads are disposed at a substantially central area between said first pair of opposed edges of said semiconductor pellet.*

*33. The semiconductor device according to claim 32, wherein said semiconductor pellet has a rectangular shape, and wherein said first pair of opposed edges are corresponding to a pair of longer edges and said second pair of opposed edges are corresponding to a pair of shorter edges.*

*34. The semiconductor device according to claim 31, wherein said slit is tapered so that opening on said second surface of substrate is greater than opening on said first surface of said substrate.*

*35. The semiconductor device according to claim 31, wherein said bump electrodes are formed of a Pb-Sn alloy.*

*36. A semiconductor device comprising:*

*(1) a semiconductor pellet of a quadrilateral shape having bonding pads formed in a main surface thereof, said semiconductor pellet having a first pair of opposed edges extending in a first direction and a second pair of opposed edges extending in a second direction which intersects with said first direction, said bonding pads being arranged in said first direction;*

*(2) a substrate having a first surface, a second surface opposite to said first surface, electrode pads formed on said second surface and slit passing through said substrate from said first surface to said second surface and extending in said first direction, said substrate including a glass fiber and resin, said semiconductor pellet being attached to said first surface of said substrate such that said main surface of said semiconductor pellet is faced to said first surface of said substrate and said bonding pads are arranged in said slit in a plane view, said electrode pads including first electrode pads arranged at one side of said slit and second electrode pads arranged at other side of said slit in said second direction, said bump electrodes being arranged on said second surface of said substrate such that some of said bump electrodes overlap with said semiconductor pellet in said plane view, respectively;*

*(3) bonding wires electrically connecting said electrode pads of said substrate with said bonding pads of said semiconductor pellet via said slit, said bonding wires including first bonding wires connected to said first electrode pads and second bonding wires connected to said second electrode pads;*

*(4) bump electrodes being disposed on said second surface of said substrate and being electrically connected to said electrode pads of said substrate, said bump electrodes including first bump electrodes electrically connected to said first electrode pads and second bump electrodes electrically connected to said second electrode pads, said first and second bump electrodes being arranged to overlap with said semiconductor pellet in said plane view respectively; and*

*(5) a resin sealing body sealing the whole of each of said bonding wires and said main surface of said semiconductor pellet exposed from said slit,*

*(6) wherein a height of said bump electrodes is greater than a thickness of said resin sealing body from said second surface of said substrate toward a top of said bump electrode in a thickness direction of said semiconductor pellet, and*

*(7) wherein a portion of each of said first and second electrode pads with where each of said first and second bonding wires is connected is arranged between said slit and said first and second bump electrodes, respectively.*

*37. The semiconductor device according to claim 36, wherein said substrate is formed of said glass fiber impregnated with said resin.*

*38. A semiconductor device comprising:*

*(1) a semiconductor pellet of a quadrilateral shape having bonding pads formed in a main surface thereof, said semiconductor pellet having a first pair of opposed edges extending in a first direction and a second pair of opposed edges extending in a second direction which*

*intersects with said first direction, said bonding pads being arranged in said first direction;*

*(2) a substrate having a first surface, a second surface opposite to said first surface, electrode pads formed on said second surface and slit passing through said substrate from said first surface to said second surface and extending in said first direction, said substrate including a glass fiber and resin, said semiconductor pellet being attached to said first surface of said substrate by way of an adhesive layer such that said main surface of said semiconductor pellet is faced to said first surface of said substrate and said bonding pads are arranged in said slit in a plane view, said electrode pads including first electrode pads arranged at one side of said slit and second electrode pads arranged at other side of said slit in said second direction, said bump electrodes being arranged on said second surface of said substrate such that some of said bump electrodes overlap with said semiconductor pellet in said plane view, respectively;*

*(3) bonding wires electrically connecting said electrode pads of said substrate with said bonding pads of said semiconductor pellet via said slit, said bonding wires including first bonding wires connected to said first electrode pads and second bonding wires connected to said second electrode pads;*

*(4) bump electrodes being disposed on said second surface of said substrate and being electrically connected to said electrode pads of said substrate, said bump electrodes including first bump electrodes electrically connected to said first electrode pads and second bump electrodes electrically connected to said second electrode pads, said first and second bump electrodes being arranged to overlap with said semiconductor pellet in said plane view respectively; and*

*(5) a resin sealing body sealing the whole of each of said bonding wires and said main surface of said semiconductor pellet exposed from said slit,*

*(6) wherein a height of said bump electrodes is greater than a thickness of said resin sealing body from said second surface of said substrate toward a top of said bump electrode in a thickness direction of said semiconductor pellet, and*

*(7) wherein a portion of each of said first and second electrode pads with where each of said first and second bonding wires is connected is arranged between said slit and said first and second bump electrodes, respectively.*

*39. The semiconductor device according to claim 38, wherein said substrate is formed of said glass fiber impregnated with said resin.*

*40. A semiconductor device comprising:*

*(1) a semiconductor pellet of a quadrilateral shape having bonding pads formed in a main surface thereof, said semiconductor pellet having a first pair of opposed edges extending in a first direction and a second pair of opposed edges extending in a second direction which intersects with said first direction, said bonding pads being arranged in said first direction;*

*(2) a substrate having a first surface, a second surface opposite to said first surface, electrode pads formed on said second surface, an insulating layer formed over said second surface such that a part of each of said electrode pads is exposed from said insulating layer and slit passing through said substrate from said first surface to said second surface and extending in said first direction, said substrate including a glass fiber and resin, said semiconductor pellet being disposed on said first surface of said substrate such that said main surface of said semiconductor pellet is faced to said first surface of said substrate and said bonding pads are arranged in said slit in a plane view, said electrode pads including first electrode pads arranged at one side of said slit and second electrode pads arranged at other side of said slit in said second direction, said bump electrodes being arranged on said second surface of said substrate such that some of said bump electrodes overlap with said semiconductor pellet in said plane view, respectively;*

*(3) bonding wires electrically connecting said part of each of said electrode pads of said substrate with said bonding pads of said semiconductor pellet via said slit, said bonding wires including first bonding wires connected to said first electrode pads and second bonding wires connected to said second electrode pads;*

*(4) bump electrodes being disposed on said second surface of said substrate and being electrically connected to said electrode pads of said substrate, said bump electrodes including first bump electrodes electrically connected to said first electrode pads and second bump electrodes electrically connected to said second electrode pads, said first and second bump electrodes being arranged to overlap with said semiconductor pellet in said plane view respectively; and*

*(5) a resin sealing body sealing the whole of each of said bonding wires, said part of each of said electrode pads and said main surface of said semiconductor pellet exposed from said slit,*

*(6) wherein a height of said bump electrodes is greater than a thickness of said resin sealing body from said second surface of said substrate toward a top of said bump electrode in a thickness direction of said semiconductor pellet, and*

*(7) wherein a portion of each of said first and second electrode pads with where each of said first and second bonding wires is connected is arranged between said slit and said first and second bump electrodes, respectively.*

*41. The semiconductor device according to claim 40, wherein said substrate is formed of said glass fiber impregnated with said resin.*

*42. A semiconductor device comprising:*

*(1) semiconductor pellet of a rectangular shape having bonding pads formed in a main surface thereof, said semiconductor pellet having a first pair of opposed edges extending in a first direction and a second pair of opposed edges extending in a second direction which intersects with said first direction, a length of each of said first pair of opposed edges being longer than that of each of said second pair of opposed edges, said bonding pads being arranged along said first direction, said bonding pads being disposed at a substantially central area between said first pair of opposed edges of said semiconductor pellet, a logic circuit system, a memory circuit system or a circuit system combined said logic circuit system and said memory circuit system being formed in said main surface of said semiconductor pellet;*

*(2) a substrate having a first surface, a second surface opposite to said first surface, electrode pads formed on said second surface and slit passing through said substrate from said first surface to said second surface and*

*extending in said first direction, a width of said slit extending in said second direction being smaller than that of said semiconductor pellet extending in said second direction, said substrate including a glass fiber and resin, said semiconductor pellet being attached to said first surface of said substrate such that said main surface of said semiconductor pellet is faced to said first surface of said substrate and said bonding pads are arranged in said slit in a plane view, said electrode pads including first electrode pads arranged at one side of said slit and second electrode pads arranged at other side of said slit in said second direction, said bump electrodes being arranged on said second surface of said substrate such that some of said bump electrodes overlap with said semiconductor pellet in said plane view, respectively;*

*(3) bonding wires electrically connecting said electrode pads of said substrate with said bonding pads of said semiconductor pellet via said slit, said bonding wires including first bonding wires connected to said first electrode pads and second bonding wires connected to said second electrode pads;*

*(4) bump electrodes being disposed on said second surface of said substrate and being electrically connected to said electrode pads of said substrate, said bump electrodes including first bump electrodes electrically connected to said first electrode pads and second bump electrodes electrically connected to said second electrode pads, said first and second bump electrodes being arranged to overlap with said semiconductor pellet in said plane view respectively; and*

*(5) a resin sealing body sealing the whole of each of said bonding wires, said first and second electrode pads and said main surface of said semiconductor pellet exposed from said slit,*

*(6) wherein a height of said bump electrodes is greater than a thickness of said resin sealing body from said second surface of said substrate toward a top of said bump electrode in a thickness direction of said semiconductor pellet, and*

*(7) wherein a portion of each of said first and second electrode pads with where each of said first and second bonding wires is connected is arranged between said slit and said first and second bump electrodes, respectively.*

*43. The semiconductor device according to claim 42, wherein said substrate is formed of said glass fiber impregnated with said resin.*

*44. A semiconductor device comprising:*

*(1) a semiconductor pellet of a rectangular shape having bonding pads formed in a main surface thereof and formed in a row, said semiconductor pellet having a first pair of opposed edges extending in a first direction and a second pair of opposed edges extending in a second direction which intersects with said first direction, a length of each of said first pair of opposed edges being longer than that of each of said second pair of opposed edges, said bonding pads being arranged along said first direction, said bonding pads being disposed at a substantially central area between said first pair of opposed edges of said semiconductor pellet, a logic circuit system, a memory circuit system or a circuit system combined said logic circuit system and said memory circuit system being formed in said main surface of said semiconductor pellet;*

*(2) a substrate having a first surface, a second surface opposite to said first surface, electrode pads formed on said second surface and slit passing through said substrate from said first surface to said second surface and extending in said first direction, said substrate including a glass fiber and resin, said semiconductor pellet being attached to said first surface of said substrate such that said main surface of said semiconductor pellet is faced to said first surface of said substrate and said bonding pads are arranged in said slit in a plane view, said electrode pads including first electrode pads arranged at one side of said slit and second electrode pads arranged at other side of said slit in said second direction, said bump electrodes being arranged on said second surface of said substrate such that some of said bump electrodes overlap with said semiconductor pellet in said plane view, respectively;*

*(3) bonding wires electrically connecting said electrode pads of said substrate with said bonding pads of said semiconductor pellet via said slit, said bonding wires including first bonding wires connected to said first electrode pads and second bonding wires connected to said second electrode pads;*

*(4) bump electrodes being disposed on said second surface of said substrate and being electrically connected to said electrode pads of said substrate, said bump electrodes including first bump electrodes electrically connected to said first electrode pads and second bump electrodes electrically connected to said second electrode pads, said first and second bump electrodes being arranged to overlap with said semiconductor pellet in said plane view respectively; and*

*(5) a resin sealing body sealing the whole of each of said bonding wires, said first and second electrode pads and said main surface of said semiconductor pellet exposed from said slit,*

*(6) wherein a height of said bump electrodes is greater than a thickness of said resin sealing body from said second surface of said substrate toward a top of said bump electrode in a thickness direction of said semiconductor pellet,*

*(7) wherein a portion of each of said first and second electrode pads with where each of said first and second bonding wires is connected is arranged between said slit and said first and second bump electrodes, respectively, and*

*(8) wherein a width of said slit extending in said second direction is the substantially same as a diameter of said bump electrode of said substrate.*

*45. The semiconductor device according to claim 44, wherein said substrate is formed of said glass fiber impregnated with said resin.*

*46. The semiconductor device according to claim 44, wherein said slit is tapered so that opening on said second surface of substrate is greater than opening on said first surface of said substrate.*

*47. The semiconductor device according to claim 44, wherein said bonding pads are arranged in said first direction to form single row of bonding pads.*

*48. The semiconductor device according to claim 26, wherein said bonding pads are arranged in said first direction to form single row of bonding pads.*

*49. The semiconductor device according to claim 31, wherein at least some of said bonding pads extend in said first direction to form a single row of bonding pads.*

*50. The semiconductor device according to claim 36, wherein said semiconductor pellet has a rectangular shape, and wherein said first pair of opposed edges are correspond-*

*ing to a pair of longer edges and said second pair of opposed edges are corresponding to a pair of shorter edges.*

*51. The semiconductor device according to claim 36, wherein said slit is tapered so that opening on said second surface of substrate is greater than opening on said first surface of said substrate.*

*52. The semiconductor device according to claim 36, wherein said bonding pads are arranged in said first direction to form single row of bonding pads.*

*53. The semiconductor device according to claim 38, wherein said semiconductor pellet has a rectangular shape, and wherein said first pair of opposed edges are corresponding to a pair of longer edges and said second pair of opposed edges are corresponding to a pair of shorter edges.*

*54. The semiconductor device according to claim 38, wherein said slit is tapered so that opening on said second surface of substrate is greater than opening on said first surface of said substrate.*

*55. The semiconductor device according to claim 38, wherein said bonding pads are arranged in said first direction to form single row of bonding pads.*

*56. The semiconductor device according to claim 40, wherein said semiconductor pellet has a rectangular shape, and wherein said first pair of opposed edges are corresponding to a pair of longer edges and said second pair of opposed edges are corresponding to a pair of shorter edges.*

*57. The semiconductor device according to claim 40, wherein said slit is tapered so that opening on said second surface of substrate is greater than opening on said first surface of said substrate.*

*58. The semiconductor device according to claim 40, wherein said bonding pads are arranged in said first direction to form single row of bonding pads.*

*59. The semiconductor device according to claim 42, wherein said slit is tapered so that opening on said second surface of substrate is greater than opening on said first surface of said substrate.*

*60. The semiconductor device according to claim 42, wherein said bonding pads are arranged in said first direction to form single row of bonding pads.*

* * * * *